United States Patent [19]

Pierce et al.

[11] Patent Number: 5,581,199
[45] Date of Patent: Dec. 3, 1996

[54] INTERCONNECT ARCHITECTURE FOR FIELD PROGRAMMABLE GATE ARRAY USING VARIABLE LENGTH CONDUCTORS

[75] Inventors: Kerry M. Pierce, Canby, Oreg.; Charles R. Erickson, Fremont, Calif.; Chih-Tsung Huang, Burlingame, Calif.; Douglas P. Wieland, Sunnyvale, Calif.

[73] Assignee: Xilinx, Inc., San Jose, Calif.

[21] Appl. No.: 368,692

[22] Filed: Jan. 4, 1995

[51] Int. Cl.⁶ .................................................. H03K 19/177
[52] U.S. Cl. .................................................. 326/41; 326/39
[58] Field of Search .......................................... 326/39, 41

[56] References Cited

U.S. PATENT DOCUMENTS

| | | | |
|---|---|---|---|
| 4,293,783 | 10/1981 | Patil | 326/41 |
| 4,642,487 | 2/1987 | Carter | 326/41 |
| 4,758,745 | 7/1988 | Elgamal et al. | 326/41 |
| 4,855,619 | 8/1989 | Hsieh et al. | 326/41 |
| 5,073,729 | 12/1991 | Greene et al. | 326/41 |
| 5,144,166 | 9/1992 | Camarota et al. | 326/41 |
| 5,204,556 | 4/1993 | Shankar | 326/39 |
| 5,469,003 | 11/1995 | Kean | 326/39 |

Primary Examiner—Edward P. Westin
Assistant Examiner—Benjamin D. Driscoll
Attorney, Agent, or Firm—Edel M. Young; Alan H. MacPherson; Norman R. Klivans

[57] ABSTRACT

An FPGA architecture is provided which uses logic unit output lines of more than one length and provides extension lines to increase the reach of a logic unit output line. The architecture allows extremely fast connections between one logic unit and another. Also, all logic unit output lines drive about the same number of buffered programmable interconnection points (PIPs) so that the signal delay between one logic unit and the next can be predicted regardless of the functions and routing which have been selected by a user. The frequency of PIPs decreases as distance from the originating logic unit increases. This has the benefit of cooperating with software which tends to place interconnected logic in close proximity. The architecture is preferably implemented with a tile layout with one logic unit in each tile, and logic unit input and output lines extending through several tiles. Thus one tile boundary is like another and there is minimum hierarchy.

29 Claims, 27 Drawing Sheets

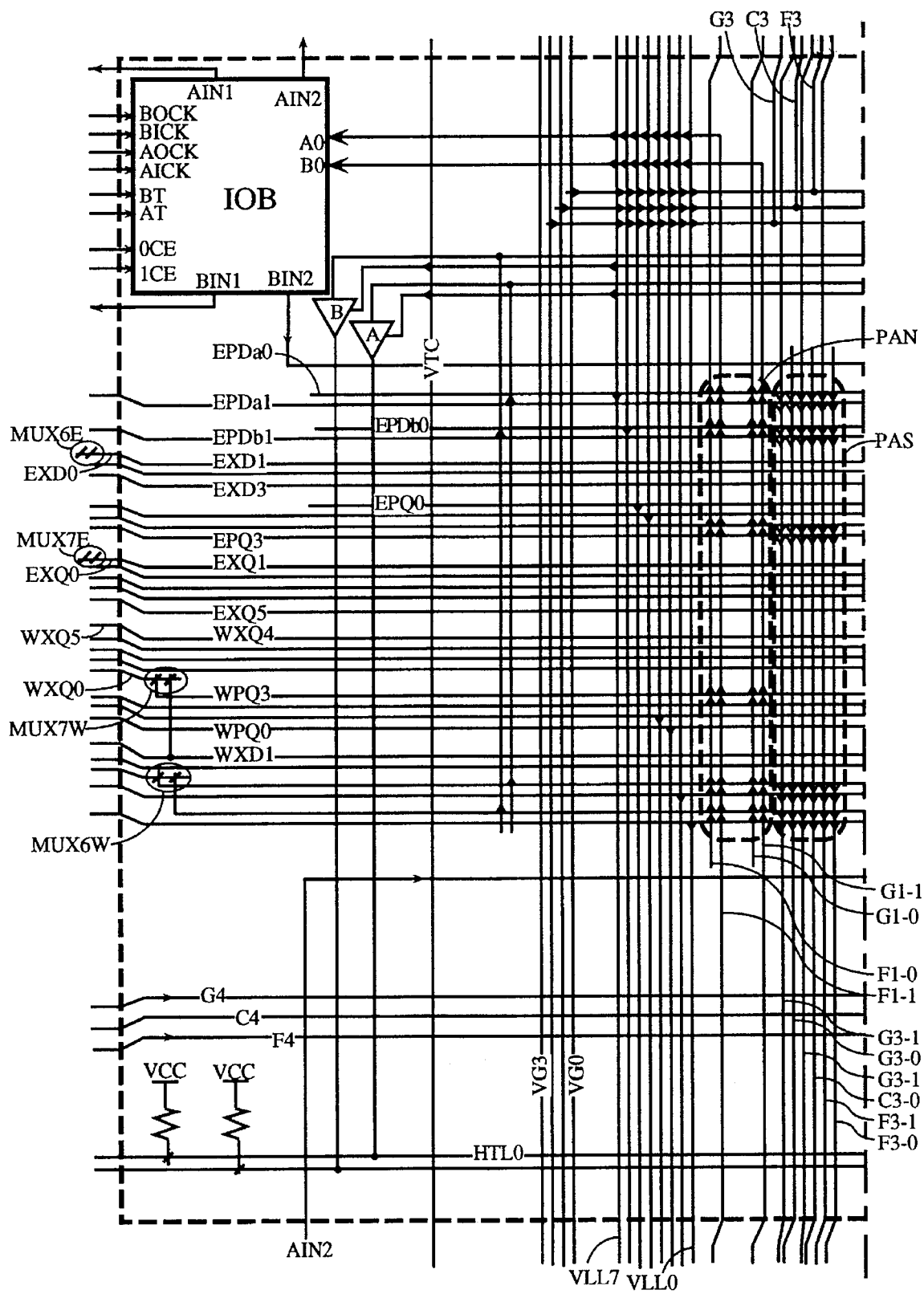
Fig. 9a  WEST TILE

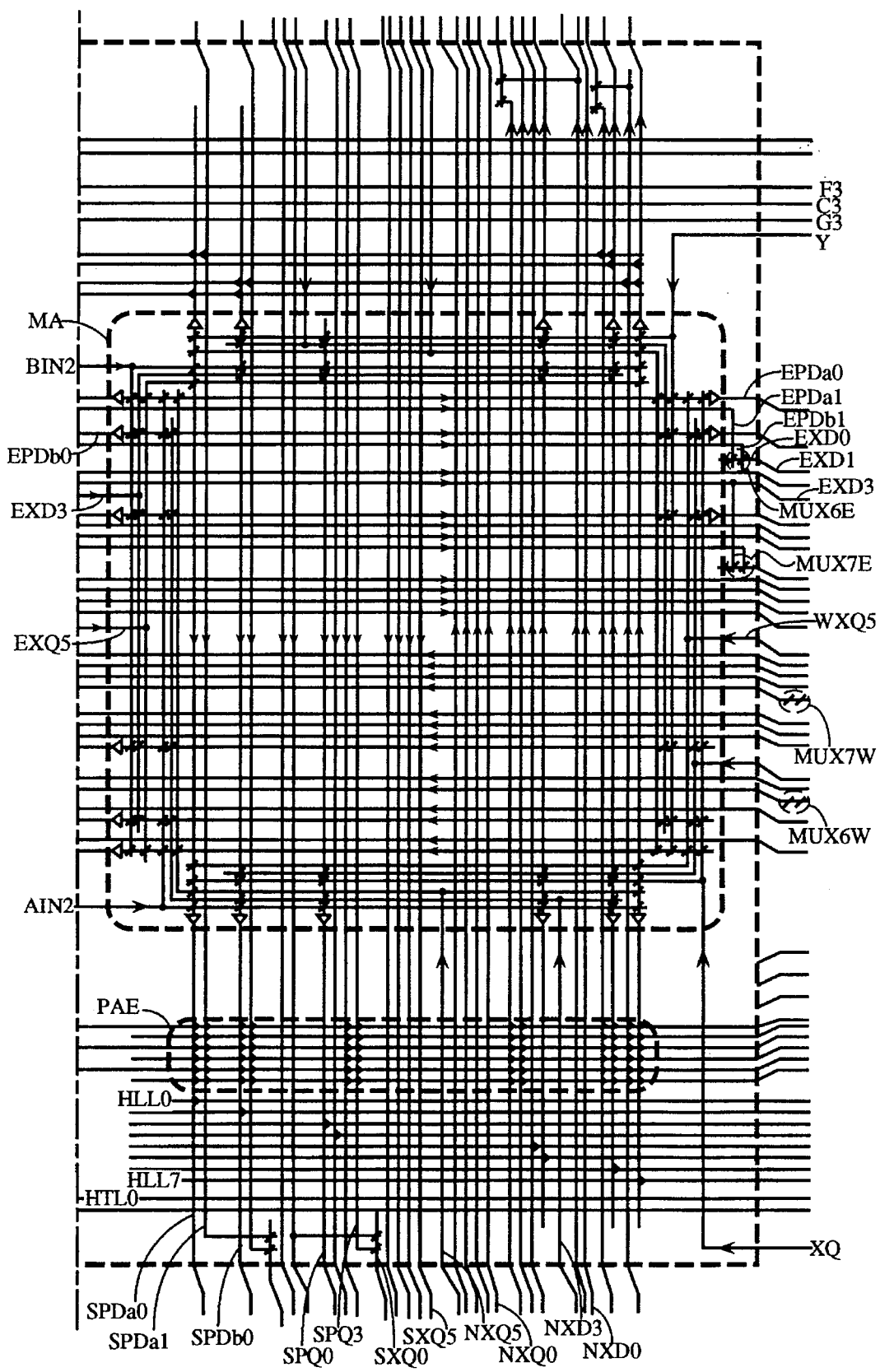
Fig. 9b  WEST TILE

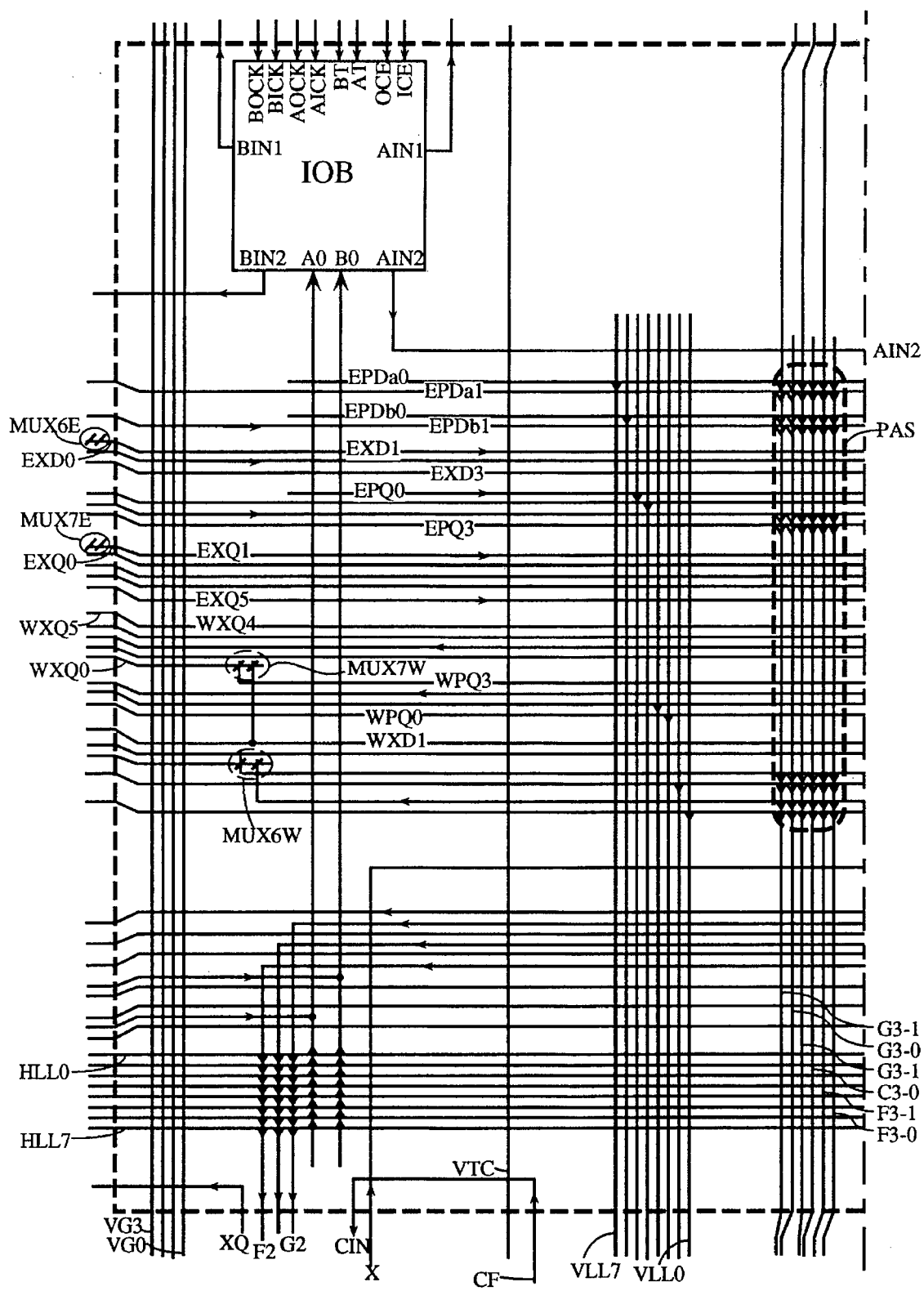
Fig. 10a  NORTH TILE

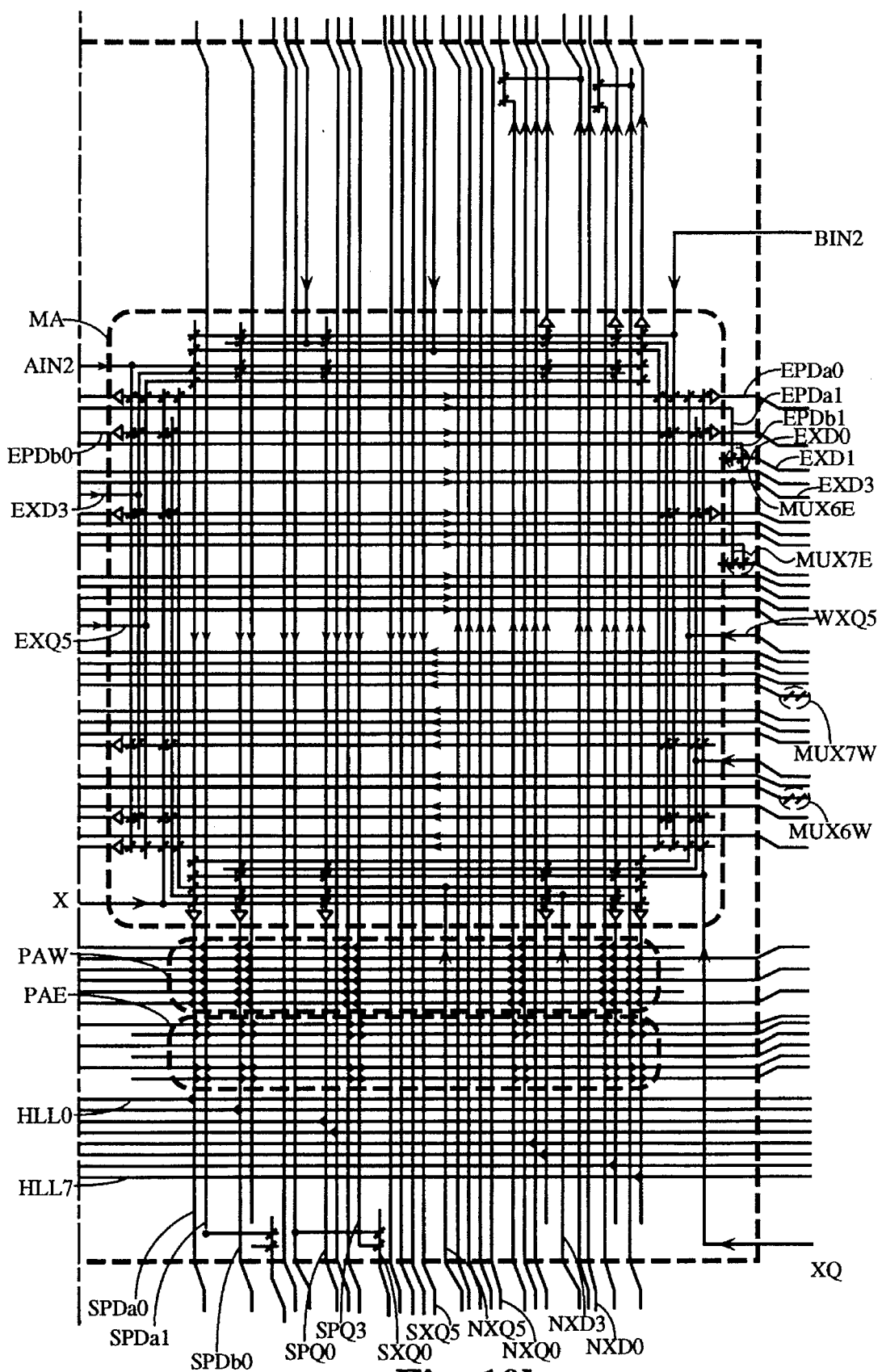
Fig. 10b NORTH TILE

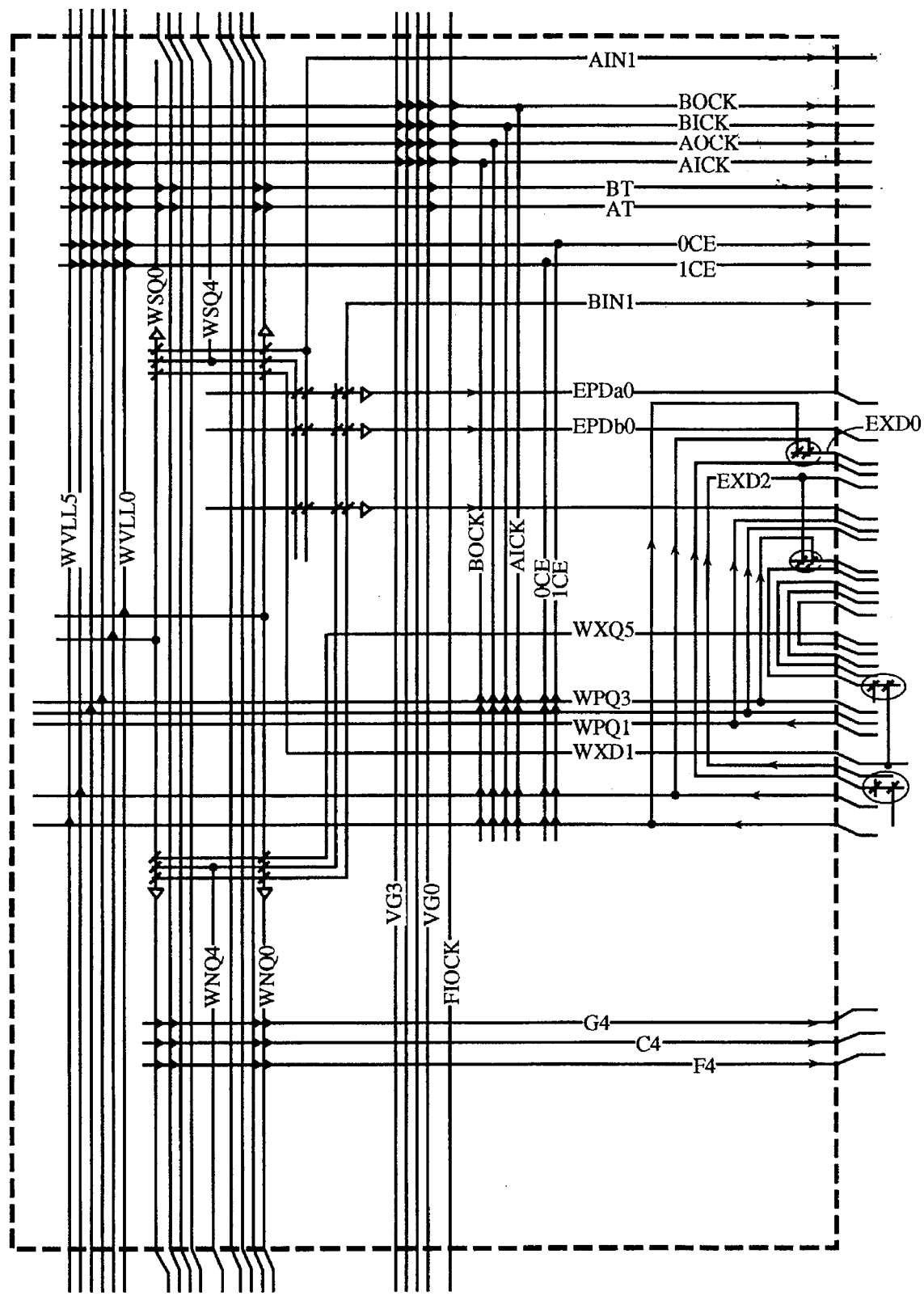
Fig. 11 WEST EDGE

Fig. 13 EAST EDGE

Fig. 15

INTERCONNECT ARCHITECTURE FOR FIELD PROGRAMMABLE GATE ARRAY USING VARIABLE LENGTH CONDUCTORS

BACKGROUND OF THE INVENTION

1. Technical Field

The invention relates to field programmable gate arrays. More particularly, the invention relates to an interconnect architecture for a field programmable gate array.

2. Description of the Prior Art

A conventional field programmable gate array ("FPGA") is a programmable logic device that consists of a matrix of configurable logic elements ("CLEs") embedded in a configurable interconnect mesh. The configuration control of the CLE functions and routing network define the function of the device. The device is referred to as a "field programmable" device because the array of CLEs contained in the device can be configured and interconnected by the user in the user's facility by means of special hardware and software.

FPGAs are well known in the art. For example, R. Freeman, Configurable Electrical Circuit Having Configurable Logic Elements and Configurable Interconnects, U.S. Pat. No. 4,870,302, issued 26 Sep. 1989 describes a configurable logic array that includes a plurality of CLEs variably interconnected in response to control signals to perform a selected logic function, and in which a memory is used to store the particular data used to configure the CLEs. W. Carter, Special Interconnect For Configurable Logic Array, U.S. Pat. No. 4,642,487, issued 10 Feb. 1987 describes a special interconnect circuit for interconnecting CLEs in an FPGA without using the general interconnect structure of the FPGA. W. Carter, Configurable Logic Element, U.S. Pat. No. 4,706,216, issued 10 Nov. 1987 describes a CLE that includes a configurable combinational logic element, a configurable storage circuit, and a configurable output select logic circuit.

A CLE may be electrically programmed by control bits to provide any one of a plurality of logic functions. A CLE may include the circuit elements necessary to provide an AND gate, flip flop, latch, inverter, NOR gate, exclusive OR gate, and certain combinations of these functions, or a CLE may include a look-up table that offers a user all functions of several input signals. The particular function performed by the CLE is determined by control signals that are applied to the CLE from a control logic circuit.

In a field programmable device, the CLE is configured to implement a selected one of its functions without any change in physical structure. In general, a specific set of control signals is transmitted to a specific CLE to control the configuration of that CLE or a set of values is loaded into a look-up table to provide the truth table of the desired function. Control signals are applied to every CLE in the device. The values of the control bits provided to a CLE depend upon the function the CLE is to perform. The configuration of each CLE is therefore determined by the user's intended function of the integrated circuit.

A conventional FPGA comprises a plurality of CLEs, each CLE having input leads and one or more output leads, a general interconnect structure, and a set of programmable interconnection points (PIPs) for connecting the general interconnect structure to each input lead and each output lead. Also, each lead in the general interconnect structure can be connected to one or more other interconnect leads by programming an associated PIP.

The various PIPs in an FPGA are typically programmed by loading memory cells which control the gates of pass transistors or by connecting selected antifuses in an antifuse FPGA. A specific FPGA configuration having a desired function is created by configuring each CLE and forming paths through the interconnect structure within the FPGA to connect the CLEs.

Each PIP in an FPGA is programmed by opening or closing one or more switches associated with the PIP, such that a specified signal path is defined. Such switches may be implemented by applying a control signal to the gate of a pass transistor. Alternatively, if the PIP is part of a multiplexer in which only one of several PIPs will be turned on at one time, several control signals may be decoded to determine which PIP is turned on.

One problem with the known approach to routing signals through an FPGA interconnect structure is caused by using many pass transistors to form a path. Each transistor has an impedance. As a result, several pass transistors connected in series can introduce a significant impedance into a path. Additionally, each interconnect lead and pass transistor introduces a capacitive element that combines with the impedance to produce a propagation delay over the associated path. Delay is especially pronounced if a long path is required because the path may be implemented through several shorter segments and several pass transistors. There is a need for an architecture which avoids the delay of longer paths and offers resource-efficient short paths.

In addition to avoiding long delays, it is desirable to offer predictable delay. The signal path chosen to interconnect one logic element to another logic element is governed by algorithms implemented in software routines. The user may exercise some control over the signal paths chosen by the software, but it is not practical for the user to control all signal paths in a design. The software may choose a large number of different interconnect segment and switch combinations to realize a particular signal path. Since the number of interconnect segments and pass transistors will vary from combination to combination, the delay through the signal path may also vary significantly, depending on the choice made by the software. This variation in delay is undesirable. It would be further advantageous to provide an FPGA interconnect structure that did not have significant delay differences depending upon the signal path realized by the software.

SUMMARY OF THE INVENTION

According to one aspect of the invention, a repeatable structure is provided which includes a logic unit capable of receiving input signals from a plurality of input lines and providing a plurality of output signals on a corresponding plurality of output lines, the output lines of one logic unit being of more than one length. The output lines of one logic unit extend past other logic units. Provided periodically along each output line is a plurality of interconnection points (PIPs). The PIPs allow the output lines to be connected to input lines of other logic units. This combination of output lines of differing lengths and PIPs allows a user to connect logic units either to nearby logic units or to logic units some distance away.

According to another aspect of the invention, the number of PIPs which may be driven by one output line is approximately the same as the number of PIPs which may be driven by each other output line. Most PIPs are buffered, that is, they comprise a buffer followed by a connector such as a transistor. Providing an approximately equal number of buffered PIPs on each output line produces the benefit that signals which propagate a short distance on an output line have approximately the same delay as signals which propagate a longer distance on a longer output line.

According to yet another aspect of the invention, the frequency of PIPs decreases as distance from the originating logic unit increases. This has the benefit of cooperating with software which tends to place interconnected logic in close proximity.

As another feature, the architecture can connect selected output lines to other output lines so that a signal path can be extended. This feature eliminates the necessity for undedicated line segments used in conventional FPGAs, although it also can work with an embodiment which includes undedicated line segments.

A tile is a schematic drawing of a portion of a circuit in which elements and lines are positioned such that an array of tiles placed side by side shows electrical continuity across the tile boundaries between lines in adjacent tiles. The architecture is preferably implemented using tiles, with one logic unit in each tile, and logic unit input and output lines extending through several tiles. One tile boundary is like another and in one embodiment there is minimum routing hierarchy. It is not necessary that all tiles be alike, although unlike tiles which are placed adjacent to each other must be compatible at their boundaries.

BRIEF DESCRIPTION OF THE DRAWINGS

FIGS. 9a and 9b illustrate a west tile usable with the embodiment of FIGS. 4a and 4b.

FIGS. 10a and 10b illustrate a north tile usable with the embodiment of FIGS. 4a and 4b.

FIG. 11 illustrates a west edge tile usable with the embodiment of FIGS. 4a and 4b.

Figure 15:
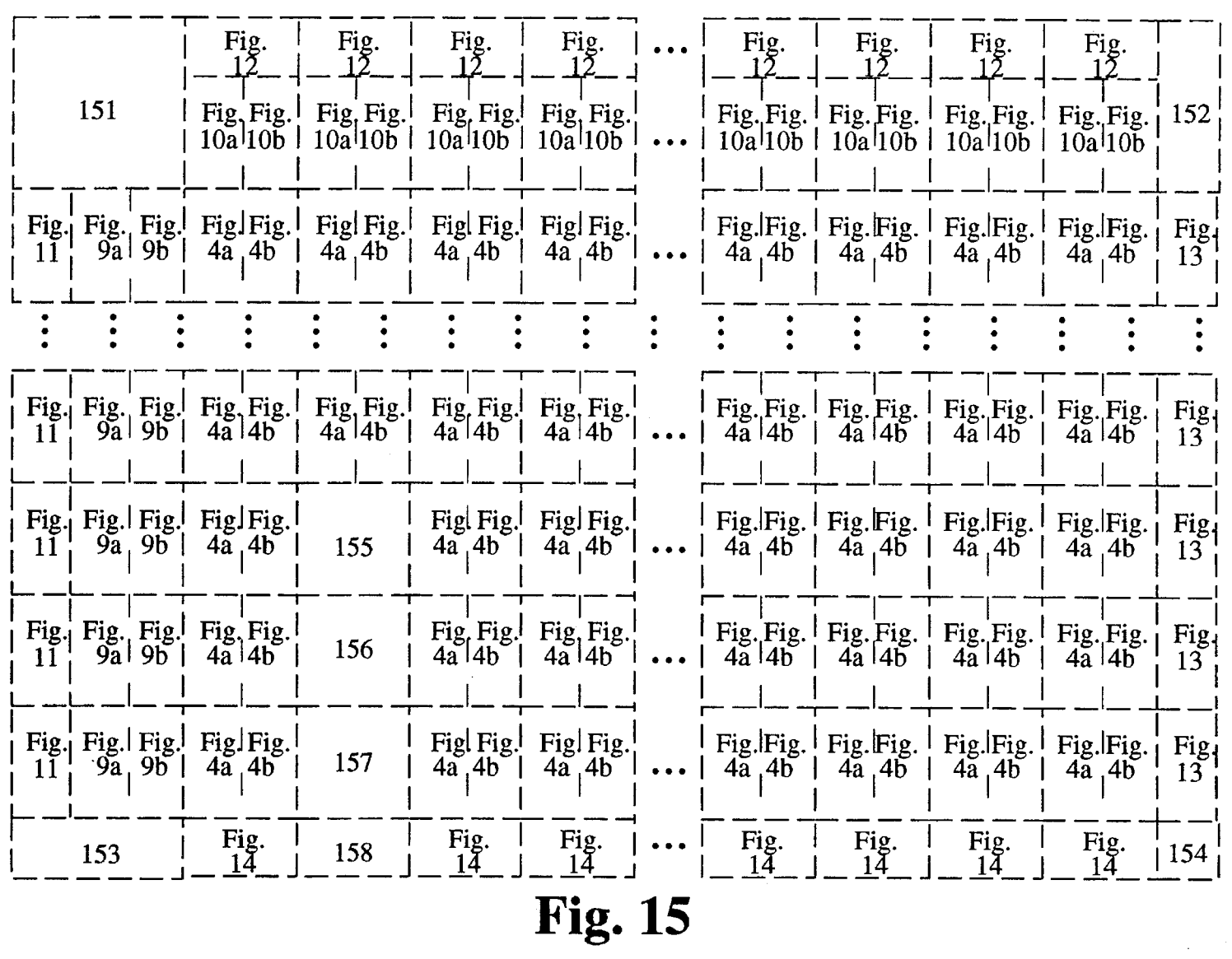

FIG. 15 illustrates the general arrangement of an FPGA which combines tiles of the types shown in FIGS. 4a, 4b, 9a, 9b, 10a, 10b, and 11–14.

DETAILED DESCRIPTION OF THE DRAWINGS

The present invention may be implemented by forming an array of identical tiles adjacent to one another. The lines in a single tile are shown such that when tiles are joined, a single CLE or logic unit and its associated input and output lines extends over several tiles. A single tile includes portions of many input and output lines associated with many different logic units. A single input or output line is made of segments, each of which is implemented in a different tile. Here the term "segment" will be used to refer to that portion of a line which is implemented in a tile, and the term "line" will refer to an entire electrically continuous conductor.

Figure 1A:
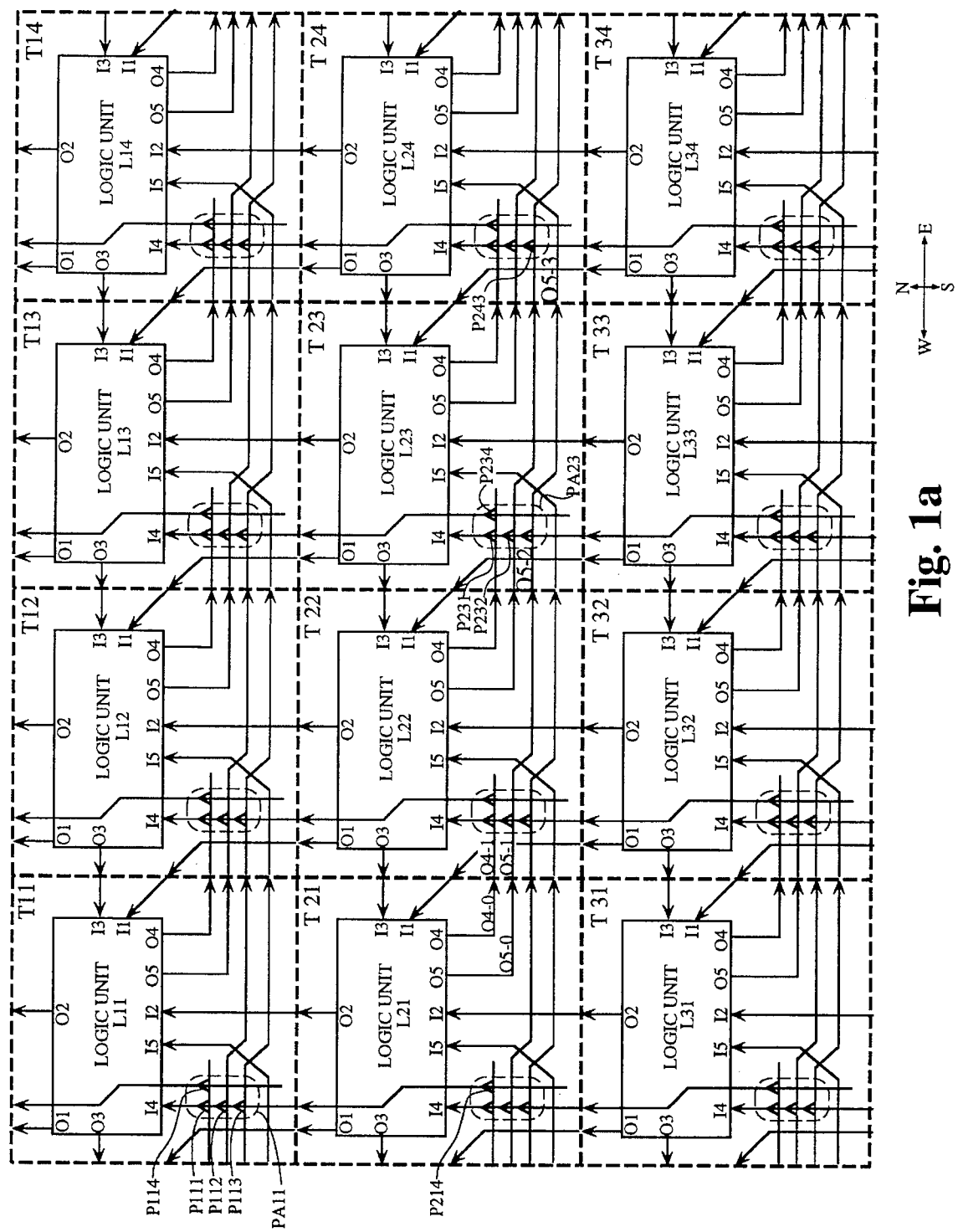
FIGS. 1a and 1b show tile architectures incorporating the invention.

FIG. 1a shows a simple embodiment which incorporates features of the invention. In FIG. 1a, twelve identical tiles T11 through T14, T21 through T24, and T31 through T34 which are part of a larger FPGA are shown. Each tile includes a logic unit, which typically performs a combination of logic and routing functions. Thus, tiles T11 through T34 include corresponding logic units L11 through L34. Each logic unit receives input signals on five logic unit input lines I1 through I5 and drives five logic unit output lines O1 through O5. Logic unit output lines O1 through O3 are direct connections to adjacent CLEs and therefore serve as input lines I1 through I3 in adjacent tiles. For example output line O1 in tile T22 is also logic unit input line I1 in tile T11, output line O2 in tile T22 is input line I2 in tile T12, and output line O3 in tile T22 is input line I3 in tile T21. By contrast, output lines O4 and O5 are programmably connectable to logic unit input lines and are of different lengths from one another. Output line O4 extends one tile to the east and output line O5 extends three tiles to the east. Output line O4 from tile T21 extends into tile T22 where it stops. Output line O5 from tile T21 extends into tile T24 where it becomes input line I5 of logic unit L24 in tile T24.

Each tile includes an array of programmable interconnection points (PIPs), each of which programmably connects two intersecting lines where the PIP is located. In FIG. 1a, each PIP array includes four PIPs. For example, PIP array PA11 in tile T11 includes PIPs P111, P112, P113, and P114. Output line O4 of tile T21 is programmably connectable to input line I4 of tile T22 through PIP P221 and to input line I4 of tile T12 through PIP P224. Thus output line O4 accesses two PIPs. Output line O5 also accesses two PIPs. For example, output line O5 in tile T21 accesses PIP P222 in tile T22 (which connects to input line I4 in tile T22) and PIP P233 in tile T23 (which connects to input line I4 in tile T13).

Thus the embodiment of FIG. 1a illustrates the logic units, the output lines of more than one length, the input lines, and the array of PIPs which programmably connect output lines to input lines.

PIP Array

A PIP array allows a user to choose whether to connect one line to another line. Each PIP has a programmable element that may be programmed by a user to open or close a switch. Thus the PIP array allows specific output lines to be coupled to specific input lines by the appropriate programming of the switches. In FIG. 1a, each PIP is represented by a triangle having its apex pointing upward or north. The top row of FIG. 2 shows some of the possible circuits which may implement this north PIP.

Figure 2:
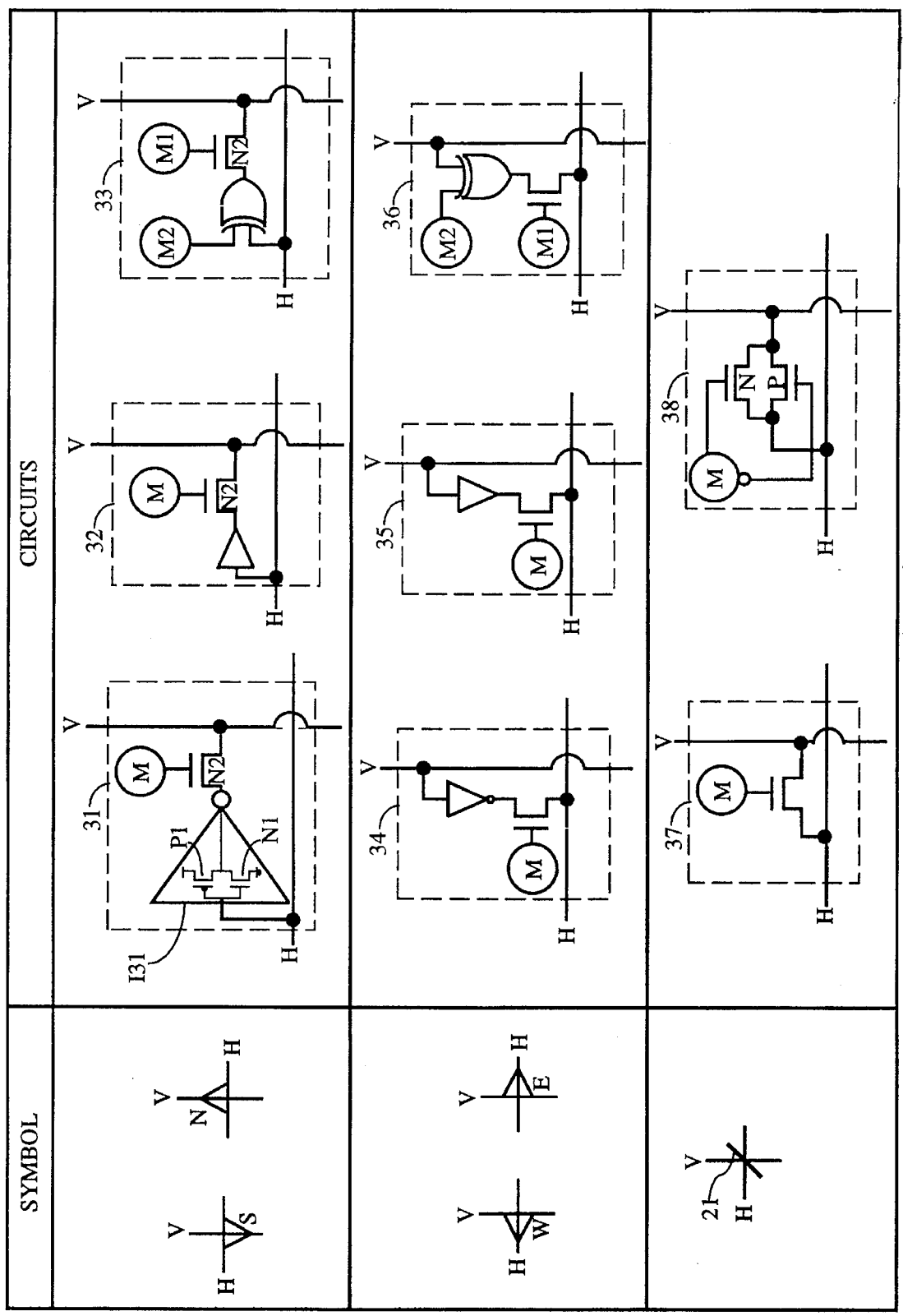
FIG. 2 shows the meaning of symbols used in FIGS. 1a, 1b, 3–6 and 9–14.

As indicated in the top row of circuits in FIG. 2, either a north PIP N or a south PIP S is implemented by a buffering device which receives input from a horizontal line H and is followed by a programmable connecting device N2 programmed by the output signal from a memory cell M. The connecting device (for example a pass transistor, transmission gate, or antifuse) receives an input signal from the buffering device. If the memory cell has been loaded with the proper value, the connecting device provides the buffered signal to the vertical line V.

Using a buffering device in conjunction with a switch causes the PIP to be directional. Of course, once a signal is placed onto a conductive line, the voltage which represents that signal is the same on the full length of the conductive line, thus the line itself is not directional. Therefore a south PIP has the same meaning as a north PIP.

Circuit 31 illustrates an inverter I31 as the buffering device and an N-channel pass transistor N2 as the connecting device. Inverting buffer I31 has an input terminal connected to horizontal line H and generates an inverted and buffered version of the signal on line H. If memory cell M has been loaded with a logic 1, transistor N2 provides the output signal from inverting buffer I31 to vertical line V. Circuit 32 illustrates a noninverting buffer as the buffering device with an N-channel pass transistor as the connecting device, and circuit 33 illustrates an XOR gate as the buffering device, which in response to a second memory cell M2 either inverts or does not invert the input signal. The connecting device is again a pass transistor. Depending upon the structure of the logic unit, other logic gates such as a NAND gate or an AND gate can serve as buffering devices. A second memory cell M2 or an internally generated control signal enables the gate to respond to the input signal. If circuit 31 is used to provide an inverted buffered signal, the polarity of the signal must be inverted in its destination CLE if the number of buffered PIPs is odd. Since an inverter I31 such as shown in circuit 31 is fast, small and efficient, it may be preferred to use this inverted implementation of a buffered PIP. FIG. 2 is further discussed in connection with FIGS. 4a and 4b.

Figure 1B:
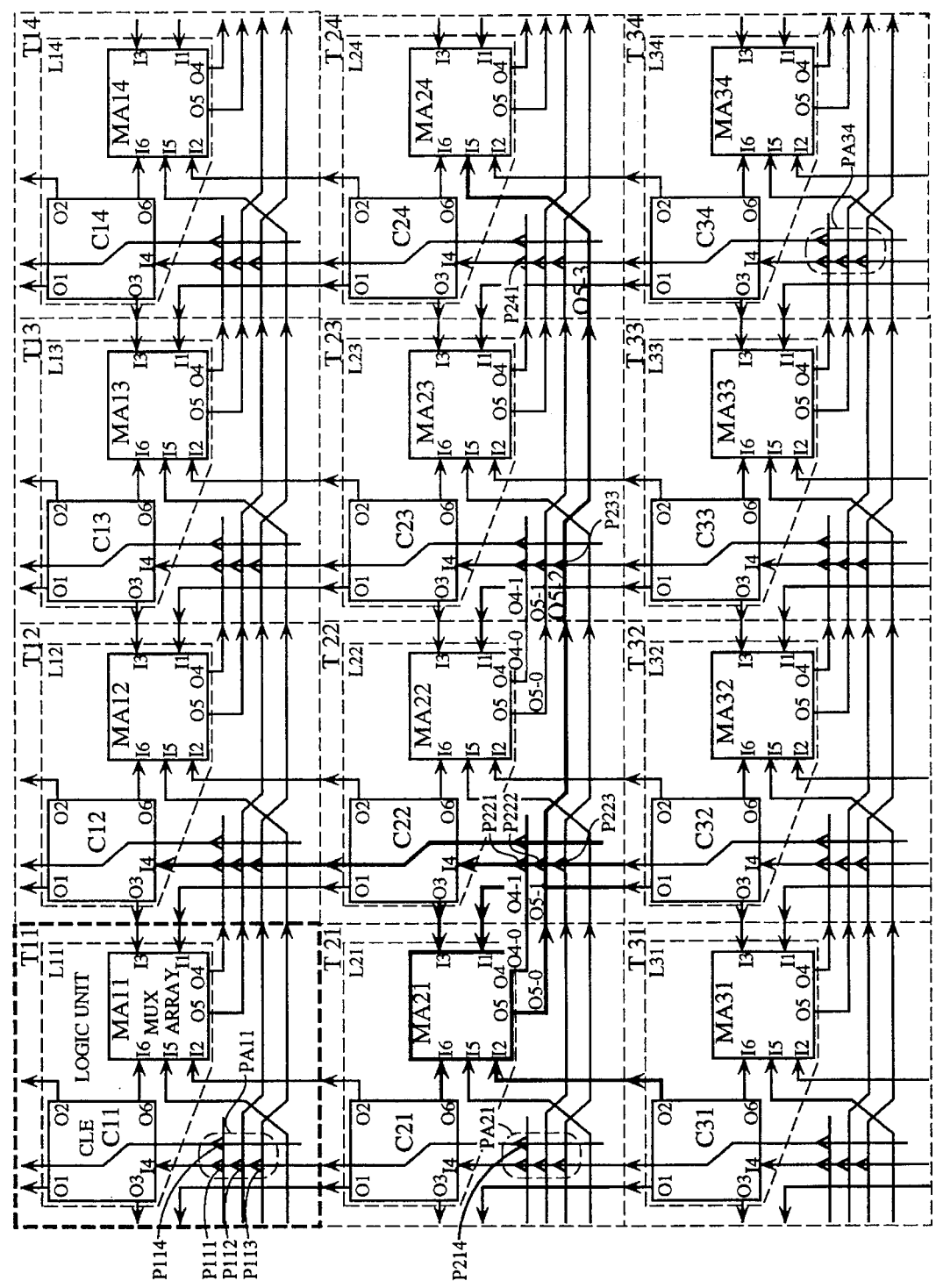

Multiplexer Embodiment, FIG. 1b

In one embodiment of the invention, each logic unit comprises a configurable logic element (CLE) and a multiplexer array or mux array. For example, in FIG. 1b logic units L11–L34 each comprise a respective one of CLEs C11 through C34 and mux arrays MA11 through MA34. The same reference numerals have the same meanings in both FIGS. 1a and 1b. Input lines, output lines, and PIP arrays are the same as in FIG. 1a, and are thus not described again. Within a logic unit, note that input lines I1 through I3 are applied to the corresponding mux array MA while output lines O1 through O3 are taken from the corresponding CLE. In addition, an output line O6 from the CLE connects to input line I6 in the mux array.

In the embodiment of FIGS. 1a and 1b, all tiles have the same architecture. In still other embodiments, adjacent tiles have different architectures. Tiles at the edges and corners of the FPGA chip typically have different architectures from those in the center of the array, as will be discussed below.

Multiplexer Array

Figure 3:
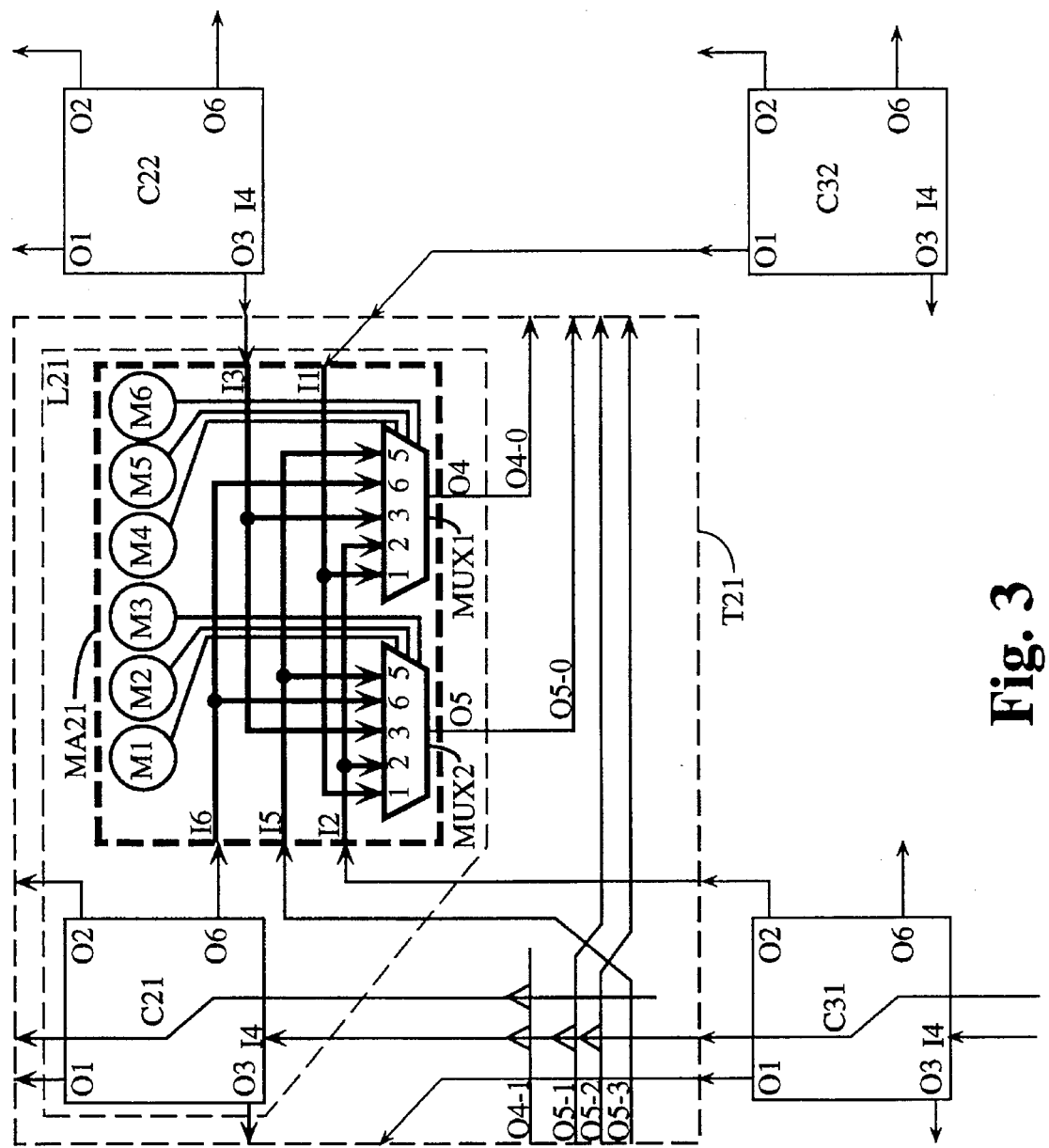
FIG. 3 shows the structure of a multiplexer array which may be used in FIG. 1b.

FIG. 3 illustrates one mux array which works with the embodiment of FIG. 1b. Mux array MA21 includes two multiplexers MUX1 and MUX2, each of which receives five input signals from five input lines I1, I2, I3, I5, and I6 and provides a selected one of the five input signals as its output signal. Memory cells M1–M6 allow each of multiplexers MUX1 and MUX2 to be separately programmable to select one of the five input signals to place onto its respective output line. Multiplexer MUX1 provides an output signal on output line O4 and multiplexer MUX2 provides an output signal on output line O5. Output lines O4 and O5 couple the multiplexer output signals to PIPs located one or more tiles away, as shown in FIG. 1b.

Whereas the mux array of FIG. 3 is an encoded structure in which three control signals, for example M1, M2, and M3 cause the multiplexer, for example MUX2, to select one of five input signals to place onto its output line, another structure can be provided in which a separate memory cell controls each line. In such an embodiment, software which generates the values which are to be placed into each memory cell assures that only one of the five memory cells causes its input line to be connected to the output line.

Referring back to FIG. 1b, output line O5 is formed in four segments in four adjacent tiles. For example, output line O5 from mux array MA21 occupies segment O5-0 in tile T21, segment O5-1 in tile T22, segment O5-2 in tile T23, and segment O5-3 in tile 24, which is applied to mux array MA24 as input line I5.

As described with reference to FIG. 3, input line I5 provides input signals to both of multiplexers MUX1 and MUX2. Multiplexers MUX1 and MUX2 also both receive input signals on lines I1 through I3 and I6 from four adjacent CLEs. In tile T22 of FIG. 1b, for example, mux array MA22 receives input signals from CLEs C22, C23, C32, and C33. Thus, although mux array MA22 is illustrated as being associated with CLE C22 in logic unit L22, in fact mux array MA22 is just as closely associated with three other nearby CLEs.

A mux array may connect an output signal from any of four neighboring CLEs or from another mux array to an output line of a selected length. Providing a choice of output lines having different lengths (two in this case) offers a user the option of providing an output signal to the next adjacent tile or to tiles further away.

Output Lines

There are a number of important features associated with the output lines.

1. Different Lengths. First, different output lines originating from a given mux array have different lengths. For example, in FIG. 1b, output line O4 from tile T21 extends one tile east, whereas output line O5 extends three tiles east. Note that the offset feature illustrated in each of the tiles, by which a horizontal line is offset lower before reaching a tile boundary, allows a single continuous line to extend through several tiles and at the same time allows adjacent tiles to be identical. The offset illustrates the connectivity which results when tiles are joined but this offset may not be present in an actual layout of such a structure on silicon.

2. Output lines drive approximately equal loads. Second, the different output signals originating from different multiplexers in a mux array are each applied to approximately the same number of PIPs, or the PIPs are sized such that each output line drives approximately the same capacitive load. For example, in FIG. 1b, the signal on output line O4 from mux array MA21 is applied to two PIPs in tile T22, and output signal O5 is applied to one PIP in tile T22 and one PIP in tile T23. As is well known in the art, propagation delay is caused by capacitive load and resistance associated with the output lines. Most of the capacitive and resistive loading experienced by the output lines comes not from metal lines but from circuits which tap off the metal lines. Since all PIPs in FIG. 1b are buffered, as shown in FIG. 2, the capacitive loading experienced by a metal output line (for example O5) driving two PIPs (PIPs P222 and P233) includes the gate regions of transistors in the PIP buffers (for example gates of transistors P1 and N1 in inverting buffer I31 of FIG. 2). But the capacitive loading experienced by this output line does not include the source, drain, and channel regions of the transistors in the buffers (for example, source, drain, and channel of transistors P1 and N1 of FIG. 2) or the source, drain, and channel regions of transistors driven by the buffers (for example transistor N2 in FIG. 2 and any transistors on vertical line V), because these buffer gate regions (i.e. gates of P1 and N1 in FIG. 2) are isolated from the structures driven by the buffers. Capacitive loading experienced by an output line is independent of whether the pass transistor (for example N2 in FIG. 2) in the PIP is turned on. Thus, the capacitive loadings of output lines O4 and O5 of FIG. 1b are predictable and approximately the same even though (a) their lengths are different, and (b) the circuit designer does not know which PIPs a user will turn on. Thus, output signals from a given mux array arrive at a variety of PIPs at approximately the same time.

Each buffered PIP drives approximately the same load. Several PIPs can drive the same input line. However, no more than one PIP will be turned on at one time to connect its respective output line to the same input line. Thus, the capacitance of an input line includes the source/drain diffusion regions of the transistors such as N2 of FIG. 2 not turned on, the conductive path (source, drain, and channel) of the transistor N2 which is turned on, and the conductive path of the buffer transistor N1 or P1 which drives the load. Since the capacitance and resistance of the input line is approximately the same regardless of which PIP is driving the input line, the delay contributed by the input line is predictable. For example, the delay in propagating a signal from mux array MA21 to CLE C22 is approximately the same as the delay in propagating a signal from mux array MA21 to CLE C13. This near constant delay helps to make timing of user designs implemented in an FPGA using the present invention predictable.

3. PIPS Decrease with Distance. A third feature associated with the output lines is that the number of PIPs accessed by a mux array output line decreases as the distance from the mux array increases. For example, in FIG. 1b, considering output lines O4 and O5 of mux array MA21, the number of PIPs accessed in tile T22 is three, the number of PIPs accessed in tile T23 is one, and the number of PIPs accessed in tile T24 is zero.

Some placement algorithms ensure that CLEs having a high number of electrical connections to other CLEs are placed close to each other. Therefore, the logic implemented in tile T21 is likely to require more electrical connections to the logic in tile T22 than to the logic in tile T23 and even less in tile T24. Because the number of PIPs connected to output lines in a given column of tiles determines the number of possible electrical connections to those tiles, the structure of FIG. 1b offers a statistical match between the distribution of PIPs and the need of a user to make particular connections. Specifically, the distribution of PIPs according to the present invention improves connection options while minimizing the total number of PIPs. Minimizing PIPs decreases capacitance, thereby increasing speed of the signal path, and also minimizing chip area, thereby decreasing chip cost.

4. Extensions. A fourth feature associated with the output lines is that at least one output signal from a mux array is provided to another mux array, thereby allowing the signal to be propagated farther with minimum delay. For example, output line O5 of tile T21 is input line I5 of mux array MA24. This signal may then be coupled to output line O5 in mux array MA24, thereby allowing the signal to be propagated farther eastward. The number of PIPs in a signal path increases by two each time the signal path passes through a mux array.

5. Several CLE Connections. Preferably, several direct connections from one CLE (FIG. 1b) to a nearby mux array or from one logic unit (FIG. 1a) to a nearby logic unit offer high speed and flexible connectivity for commonly used connections. Output lines O1, O2, and O3 offer connections to nearby CLEs or logic units in the northwest, north, and west directions, respectively.

Input Lines

An input line carries a signal from a selected one of a plurality of PIPs to a logic unit or CLE input port. In FIG. 1b, input lines I4 connect one of four PIPs to a respective CLE input port. (In FIG. 1b only one input line I4 to a CLE is shown, although in an actual CLE, input signals will be available from several input lines, as will be discussed in connection with the preferred embodiment.) For example, regarding CLE C24, if PIP P241 in tile T24 is connected, input line I4 to CLE C24 is driven by a signal on output line O4 from tile T23. If PIP P242 is connected, input line I4 is driven by a signal on output line O5 from tile T23. If PIP P243 is connected, input line I4 is driven by a signal on output line O5 of tile T22. The fourth PIP which drives input line I4 in CLE C24 is in tile T34. If PIP P344 in tile T34 is connected, input line I4 to CLE C24 is driven by a signal on output line O4 in tile T33.

Preferred Embodiment

FIGS. 4a through 16 illustrate several views of a preferred embodiment of the invention.

Figure 4A:
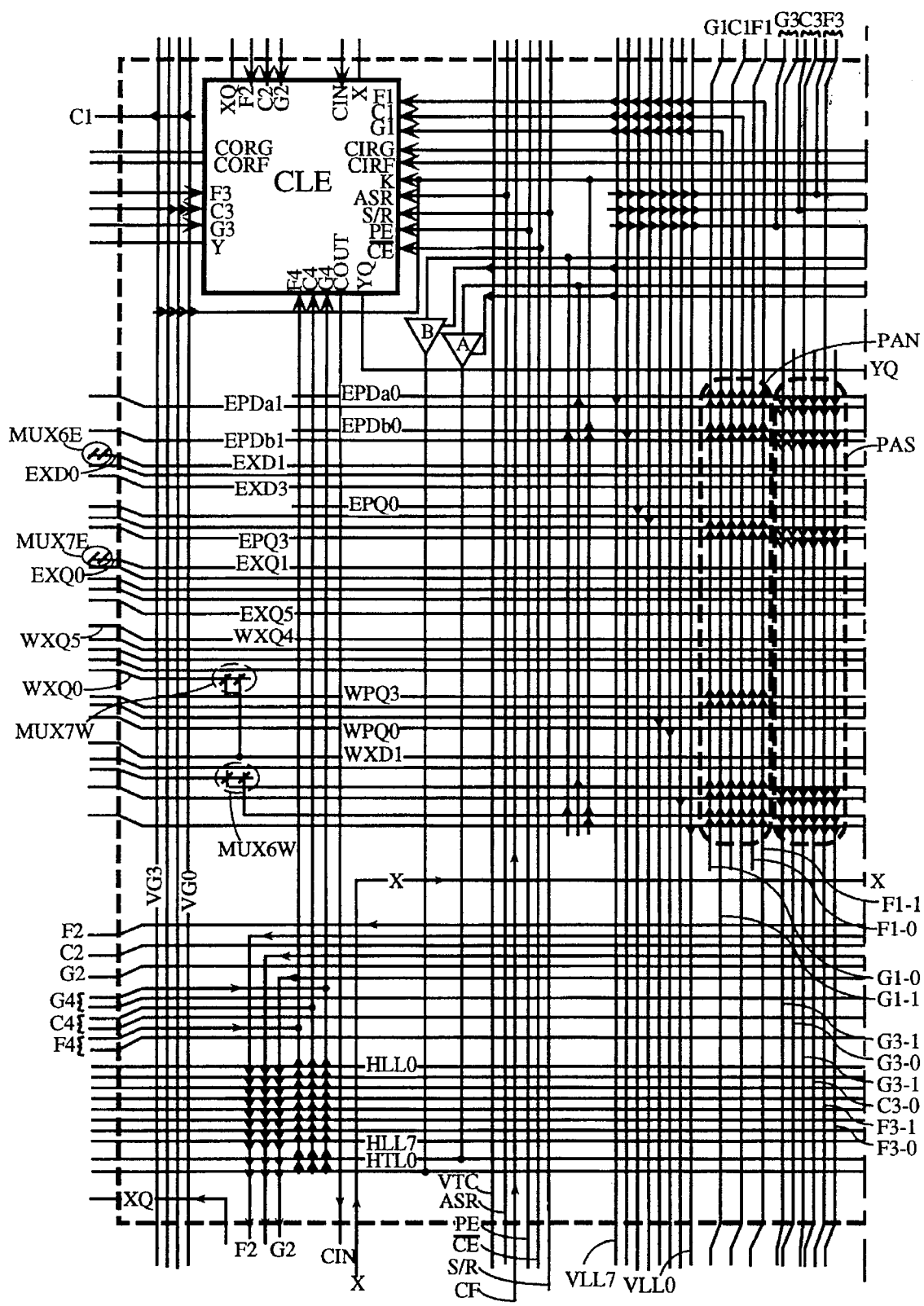
FIGS. 4a and 4b illustrate one tile according to a preferred embodiment of the invention.
Figure 4B:
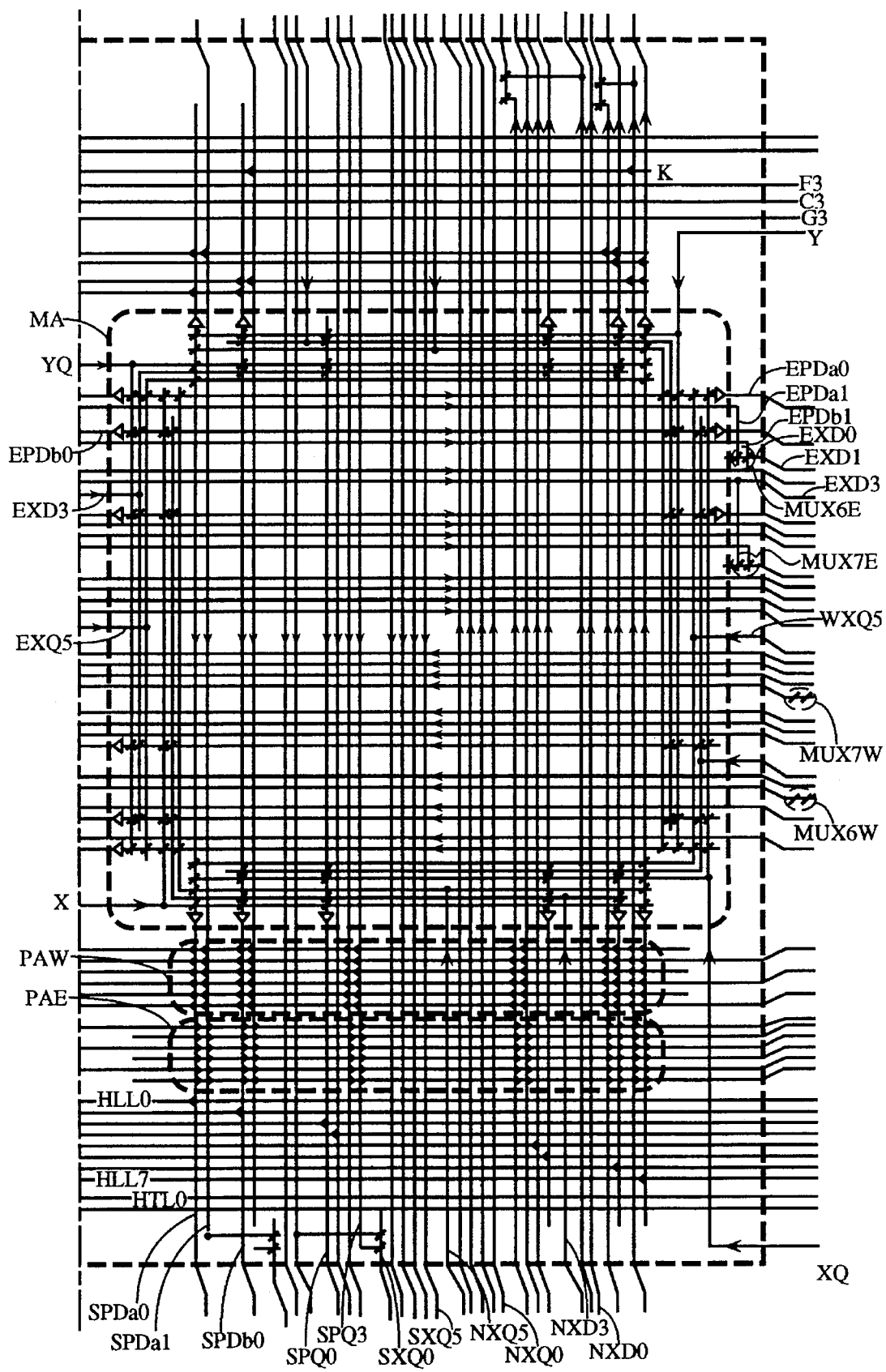
Figure 5A:
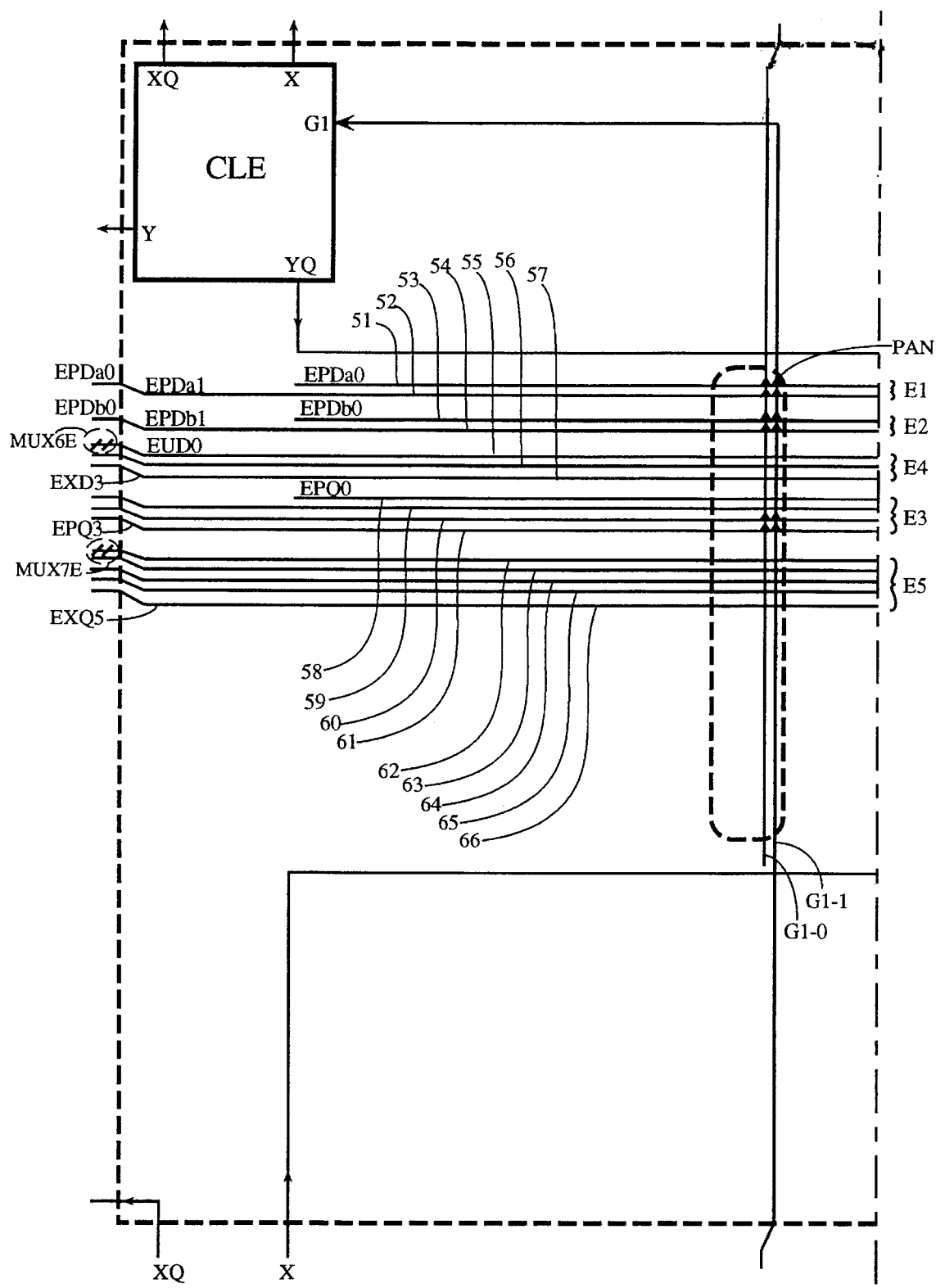
FIGS. 5a and 5b illustrate portions of the tile of FIGS. 4a and 4b.
Figure 5B:
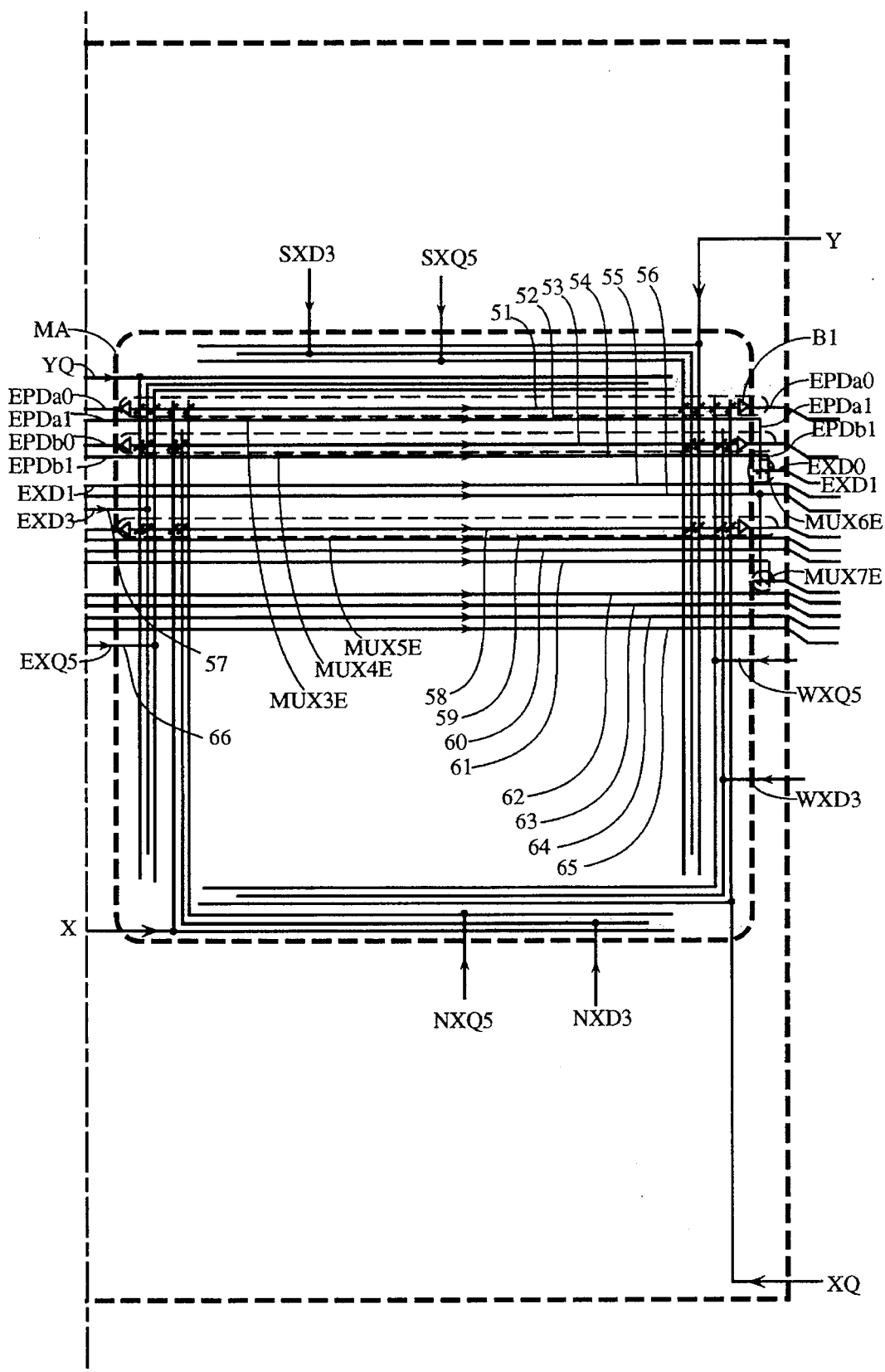
Figure 6A:
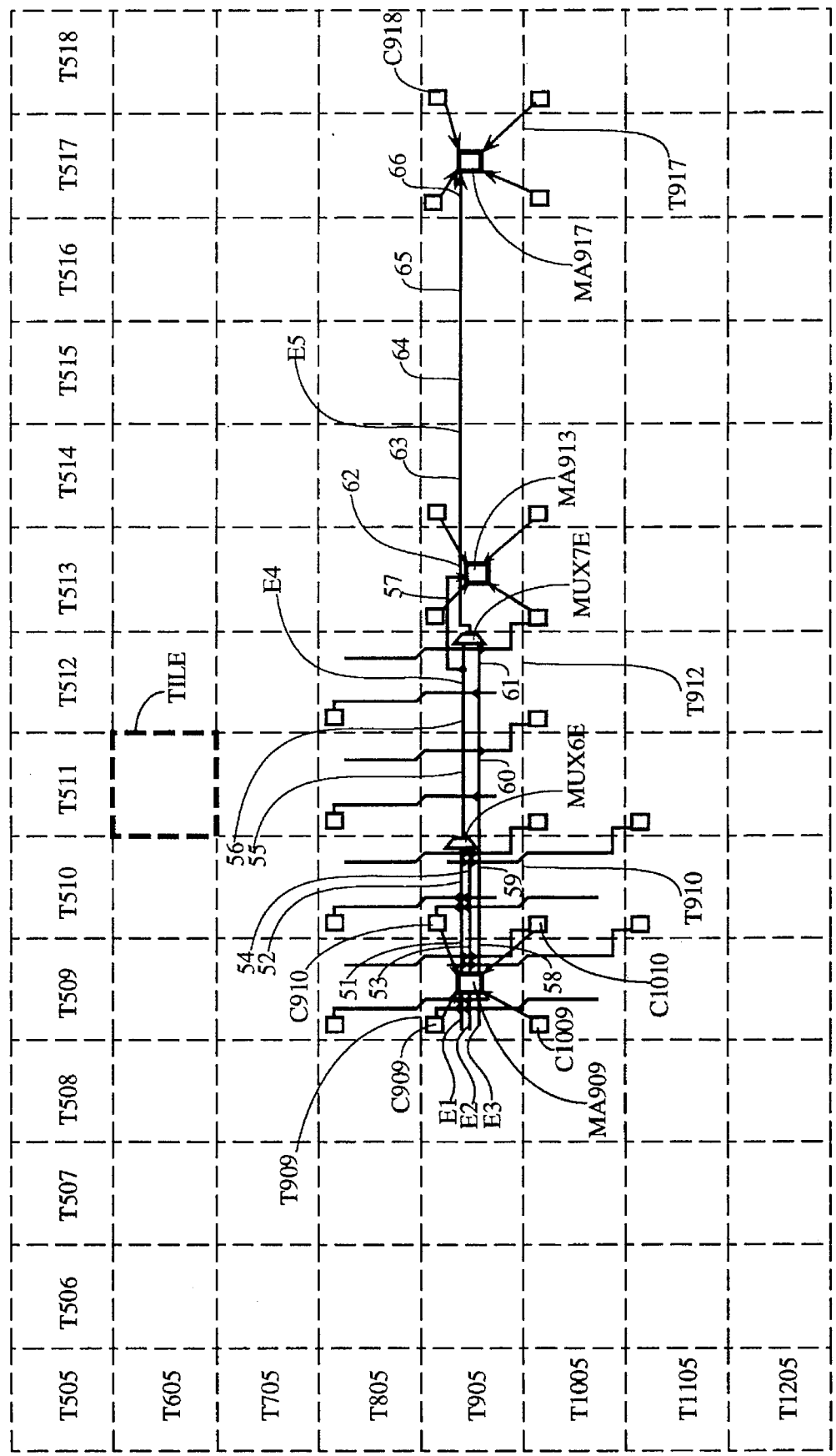
FIG. 6a illustrates the equivalent circuit formed by the illustrated lines in FIGS. 5a and 5b when adjacent tiles are connected to form an FPGA circuit according to the invention.
Figure 6B:
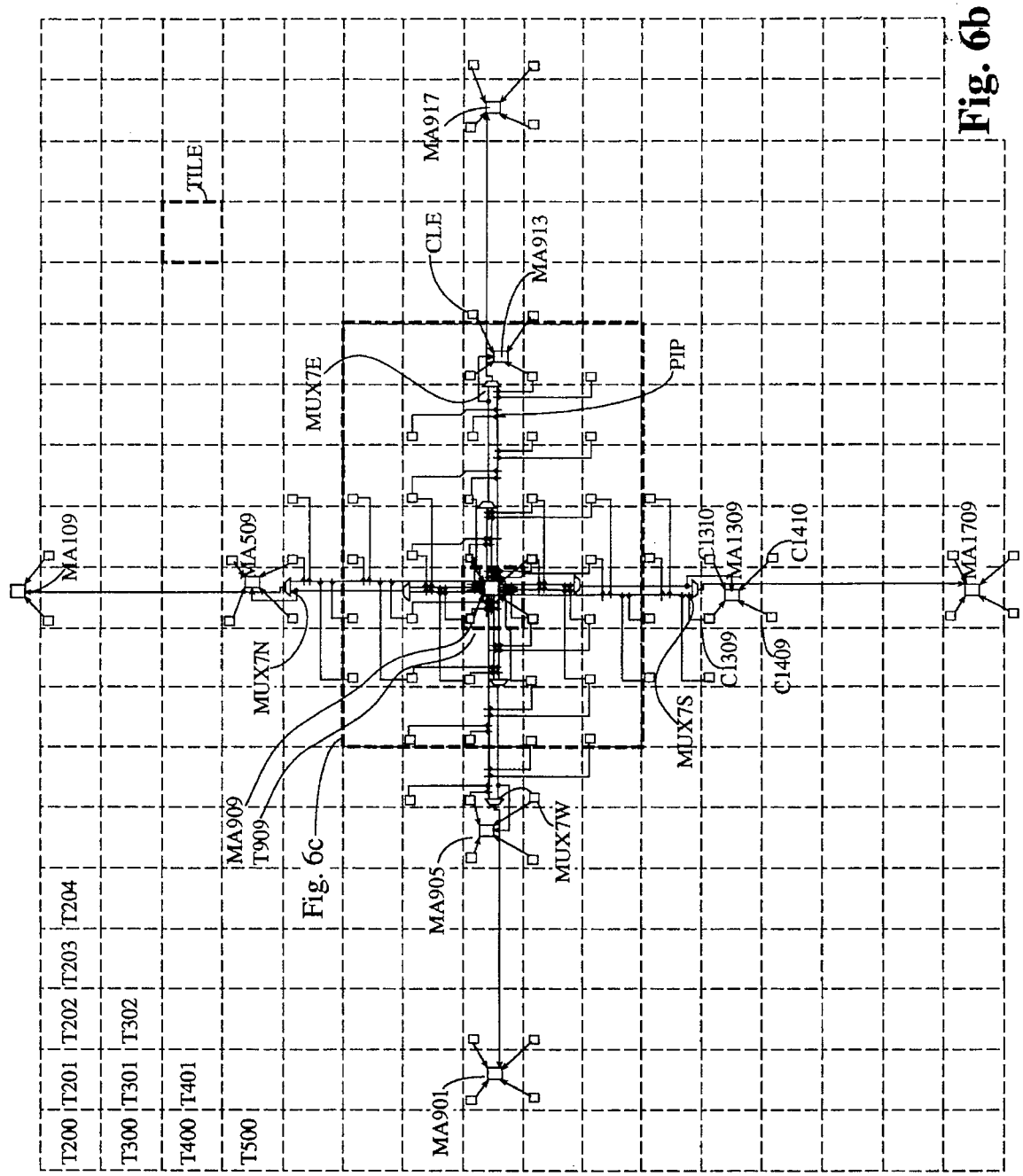
FIGS. 6b and 6c illustrate most of the equivalent circuit formed by the structure of FIGS. 4a and 4b.
Figure 6C:
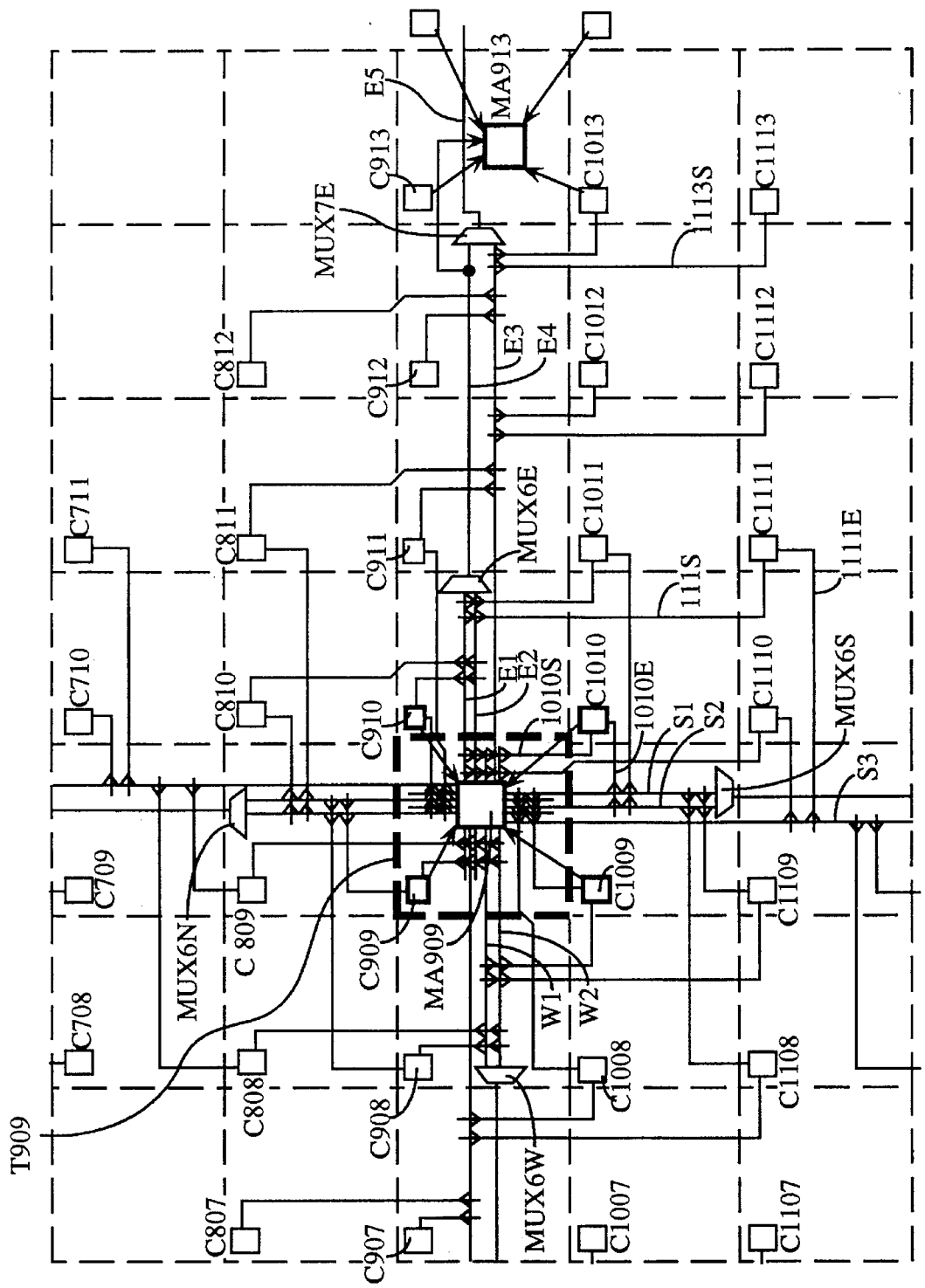
Figure 7:
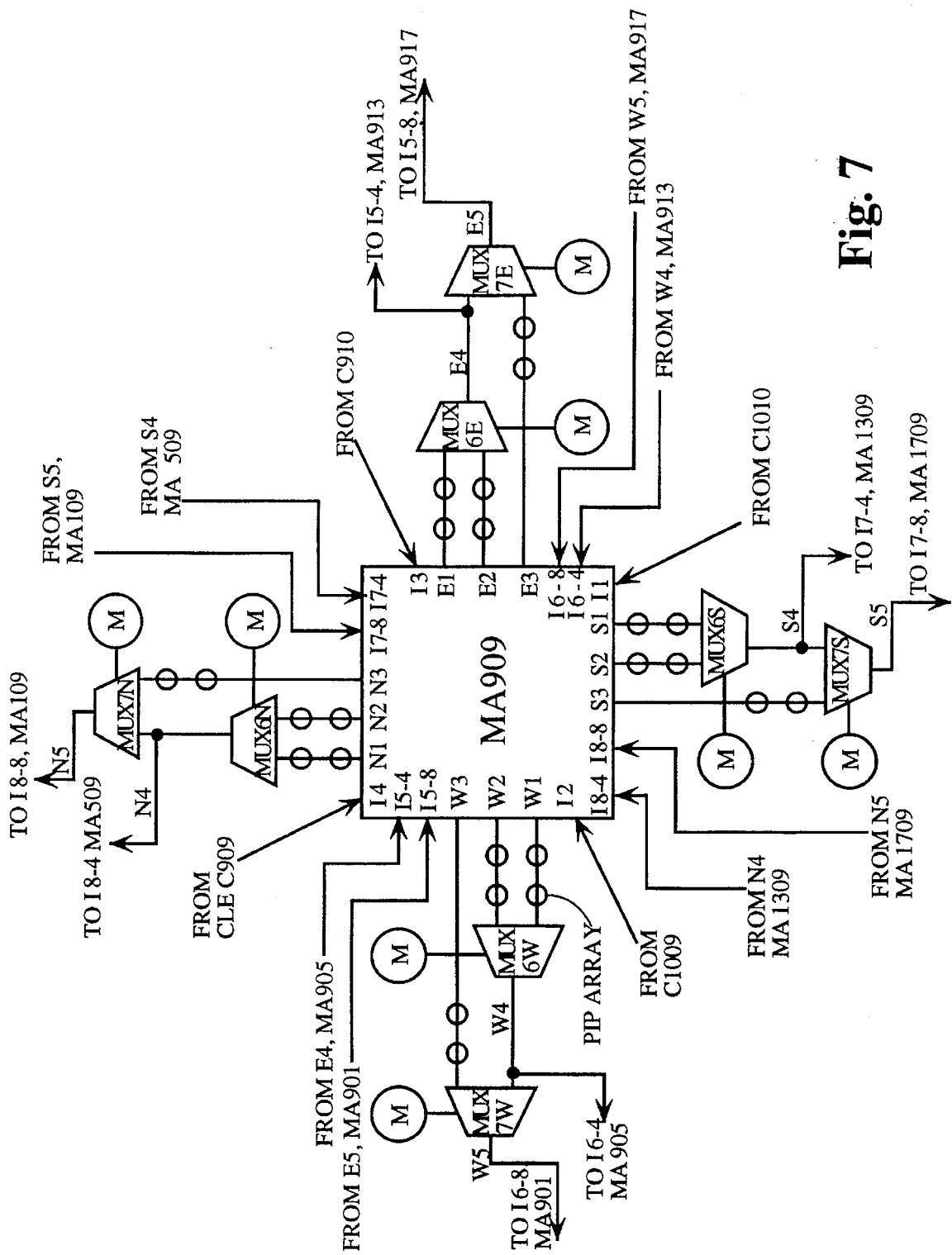
FIG. 7 is another illustration of the circuit formed by tiles of the architecture of FIGS. 4a and 4b.

FIGS. 4a and 4b together show one complete tile according to a preferred embodiment. FIGS. 5a and 5b show this same tile with lines removed in order to simplify the discussion. FIG. 6a shows one of the structures which results when an array of tiles shown in FIGS. 5a and 5b is connected. FIGS. 6b and 6c show most lines in the structure which results when an array of tiles shown in FIGS. 4a and 4b is connected. FIG. 7 shows another representation of the structure of FIG. 6b. These figures will now be described collectively.

FIGS. 4a and 4b include the same major elements illustrated in FIG. 1b, i.e. a repeatable tile is shown having a CLE and a mux array, segments of output lines, segments of input lines, and PIP arrays. At the upper left corner of FIG. 4a is a CLE. Also in FIG. 4a are two PIP arrays, north PIP array PAN for directing signals from the mux array north and south PIP array PAS for directing signals from the mux array south. To ensure predictable timing, in a preferred embodiment all PIPs which drive logic unit input lines are buffered connections except that PIPs which extend the reach of a multiplexer output line are unbuffered connections. Use of both a south arrow and a north arrow is employed in FIGS. 4a through 14 to indicate the signal flow which results from the PIP, even though the N and S PIP symbols represent the same structure.

FIG. 4b illustrates mux array MA, east PIP array PAE and west PIP array PAW for directing signals from mux array MA east and west respectively. As shown in the middle row of FIG. 2, the east and west PIPs E and W represent the same structure, but represent a different structure from the north and south PIPs N and S. An east or west PIP indicates that a signal on vertical line V is first buffered, then optionally connected to horizontal line H. Circuits 34, 35, and 36 illustrate three possible implementations of an east or west PIP. In the case of E and W PIPs, the input line is vertical line V and the output line is horizontal line H.

FIGS. 5a and 5b illustrate a portion of FIGS. 4a and 4b, specifically, those multiplexers in mux array MA which generate eastgoing output signals and segments of one input line driven by PIP array PAN, namely the G1 input line of configurable logic element CLE. Also remaining in FIGS. 5a and 5b are the CLE output lines X, Y, XQ and YQ. Note that by combining a group of tiles such as in FIGS. 5a and 5b, the output lines X, Y, XQ and YQ of configurable logic element CLE provide input signals to four different mux arrays MA.

Line segments in FIGS. 4a, 4b, 5a, and 5b are given letter and number combinations to indicate their length and direction. For example, line segment EPDa0 is an east-going PIP-driving segment of a double length line zero tiles from where the line originates. Line segment EXD1 is an east-going extension segment of a double length line one tile from where the line originates. Line segments in FIGS. 5a and 5b are also given simpler two-digit numbers and the same numbers are used in FIGS. 6a and 7 to indicate the same segments.

The tile of FIGS. 5a and 5b, includes adjacent segments 51 and 52. In an array of tiles, each tile has a segment 51 and a segment 52. Segment 51 in a given tile electrically connects to segment 52 in the tile directly to the east, thereby forming one double length line E1, as illustrated in FIG. 6a by segment 51 in tile T909 and segment 52 in tile T910. Similarly, another pair of segments 53 and 54 shown in FIGS. 5a and 5b also join, as shown in FIG. 6a at the junction of tiles T909 and T910, to form another double length line E2. Each of these double-length lines E1 and E2 can be connected in PIP array PAN (see FIG. 5a) to the G1 input line of a respective CLE. Line segments 55 and 56 in tiles T911 and T912 form line E4 thus further illustrating the continuity from tile to tile provided by joining adjacent tiles having the structure of FIGS. 5a and 5b.

The collection of PIPs illustrated in FIG. 5b as MUX3E behaves as a multiplexer because a control structure (not shown but well known) allows only one of the PIPs in multiplexer MUX3E to be connected at one time to line segment 51. Multiplexers MUX3E, MUX4E, and MUX5E each selectively connect one of eight input signals to an east going output line segment 51, 53, or 58, respectively. In multiplexer MUX3E, eight PIPs connect a selected one of CLE lines X, Y, XQ, YQ, and quad-length extension line segments EXQ5, NXQ5, SXQ5, and WXQ5 to line segment 51. The eight input signals received by multiplexer MUX4E are from the four adjacent CLEs on lines X, Y, XQ and YQ and four nearby mux arrays, on east extension line segments EXD3, NXD3, WXD3 and SXD3. Multiplexer MUX5E selects from the same set of eight input signals as multiplexer MUX4E in the present embodiment. The output line from multiplexer MUX5E is a quad-length line E3 including line segment 58 in tile T909, segment 59 in tile T910, segment 60 in tile T911, and segment 61 in tile T912. Thus (see FIG. 6a) quad-length line E3 extends almost four tiles to the right of mux array MA909, through four MUX arrays, to provide an input signal to multiplexer MUX7E in tile T912.

Figure 5C:
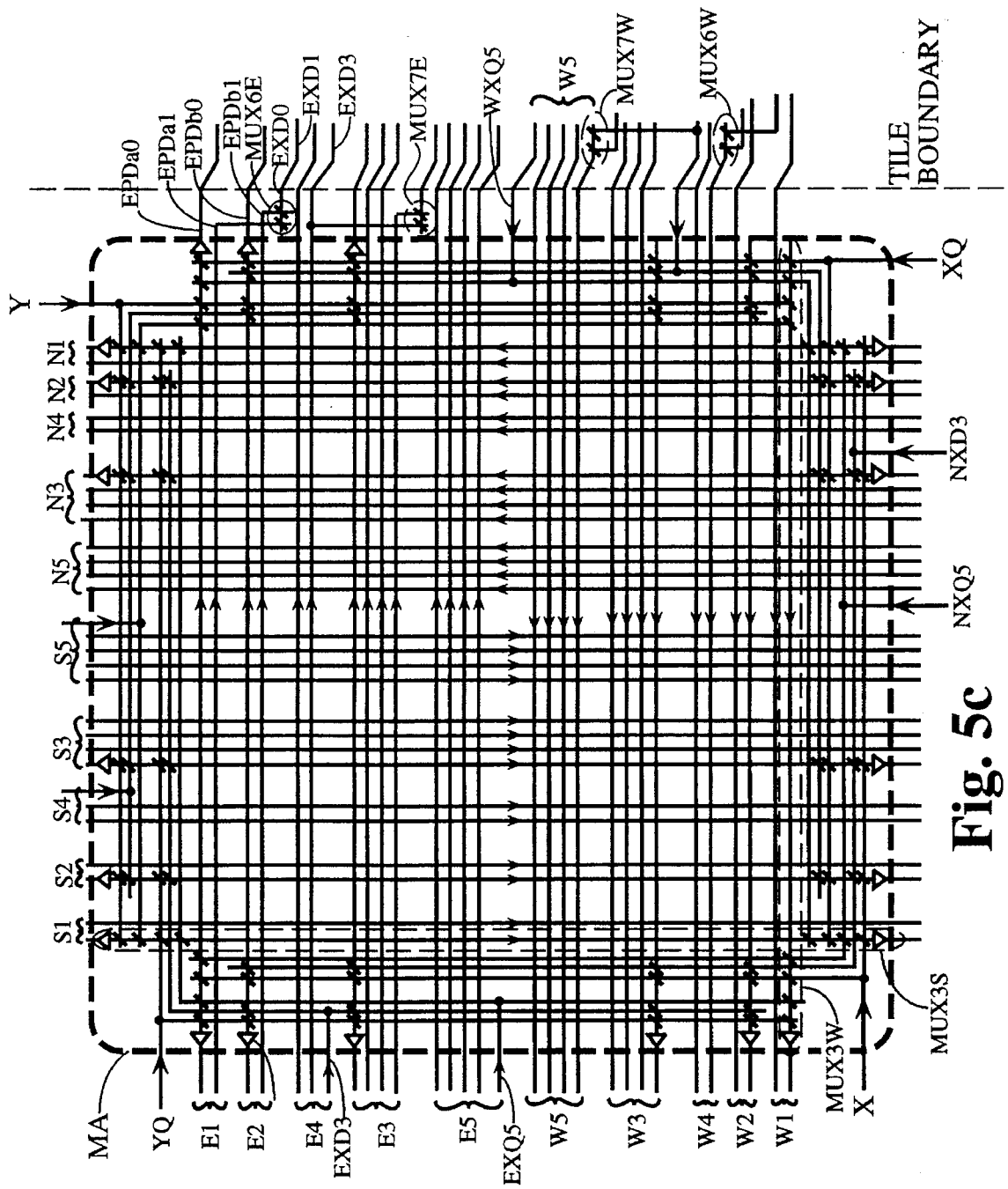
FIG. 5c is an enlarged view of the mux array of FIG. 4b.

FIG. 5c is an enlarged view of mux array MA of FIG. 4b. Most labels at the left and top of FIG. 5c are line labels while most labels at the right of FIG. 5c are segment labels. Multiplexers MUX3S and MUX3W are labeled at the bottom of FIG. 5c and includes eight PIPs which drive south output line S1. Starting from the top PIP of MUX3S, PIPs are available to connect the eight input lines Y, S5, YQ, E5 (segment EXQ5), W5 (segment WXQ5), N5 (segment NXQ5), XQ, and X to output line S1. In one embodiment, a control structure not shown turns on only one or none of these eight PIPs to drive output line S1. In another embodiment, any number of PIPs from zero to eight can be turned on, and software which determines which PIPs to turn on selects no more than one PIP to turn on. (If none of the eight input PIPs is driving output line S1, a default constant voltage will be applied to the line to avoid leaving the line floating, for example by connecting a small pullup resistor to the line.)

Multiplexer MUX3W drives west output line W1. There are twelve multiplexers in mux array FLA. For simplicity, other multiplexers are not labeled in FIG. 5c. However, the other ten multiplexers in mux array MA can be deduced by looking at multiplexers MUX3S and MUX3W and the multiplexers labeled in FIG. 5b. In this embodiment, the eight input lines which can be connected to a multiplexer output line always include the four CLE input lines X, Y, XQ, and YQ, and include either the double length extension lines N4, S4, E4, and W4 or the quad-length extension lines N5, S5, E5, and W5. Of course, many other embodiments can be envisioned, and the invention is not limited to the illustrated embodiment.

In FIG. 5c, line length can be deduced from looking at the groupings of line segments into a line. Line E1 includes two segments and is therefore two tiles long. Line E4 is somewhat more than two tiles long as it includes a short line segment EXD0 at the right of FIG. 5c and a short line segment EXD3 at the left of FIG. 5c. Line E3 includes four segments and is thus four tiles long. Line E5 is somewhat more than four tiles long, having segments less than a full tile length at the right and left of FIG. 5c. From this explanation, line lengths can be deduced from examining segments in the complete tile of FIGS. 4a and 4b.

FIGS. 6a–6c give an overview of the connectivity which results when adjacent tiles are joined. Mux array MA909 in tile T909 receives mux array input signals from CLEs C909, C910, C1009 and C1010 in tiles of the same suffix. These mux array input signals from CLE's are shown with arrowheads to emphasize the direction of signal flow. Mux array MA909 provides output signals in four directions, as is illustrated in FIG. 6b. However, for simplicity, FIG. 6a illustrates only the eastgoing output signals. FIGS. 6a–6c are also simplified from the structure by not showing all CLE input lines and related PIPs. Whereas FIGS. 4a and 4b show 12 CLE input lines F1–F4, G1–G4, and C1–C4, FIGS. 6a–6c show at most one or two input lines to a CLE and the related PIP connecting from the output line.

At the right edge of tile T910 in FIG. 6a, extension multiplexer MUX6E receives input signals from segments 52 and 54 and provides an output signal on segment 55 in tile T911 which connects to segment 56 in tile T912. The diagonal line symbols shown in FIG. 5b in extension multiplexer MUX6E are illustrated in FIG. 2 by diagonal line 21. This diagonal line symbol is used to represent an unbuffered PIP. An unbuffered PIP can be implemented by a single pass transistor as shown in circuit 37 of FIG. 2, by a transmission gate (comprising a P channel transistor and an N channel transistor in parallel) as shown in circuit 38 of FIG. 2, by an antifuse, fuse, EPROM, EEPROM, or by any other form of connection. Returning to FIG. 6a, also provided from multiplexer MA909 is a quad-length line E3 comprising line segments 58 through 61 in adjacent tiles T909 through T912. Signals on line segments 61 and 56 (lines E3 and E4) are applied at the right edge of tile T912 to multiplexer MUX7E, as also illustrated in FIG. 5b, which drives a quad-length line E5 comprising line segment 62 in tile T913 through line segment 66 in tile T917. (Line E5 is actually about 4½ tiles long.) Line E5 in turn provides an input signal to mux array MA917 in tile T917.

Regarding FIG. 5b, the illustrated part of mux array MA comprises three multiplexers MUX3E–MUX5E for directing signals eastward. Adjacent to mux array MA are the two extension multiplexers MUX6E and MUX7E. Each of these multiplexers is controlled by a multiplexer control structure (not shown but well known) which causes only one of the PIPs in that multiplexer to be turned on at one time, thereby selecting which multiplexer input signal is provided on that multiplexer's output line. For example, in multiplexer MUX3E, the control structure selects one of the signals from lines X, Y, XQ, YQ from four adjacent CLEs, and one of the signals from quad-length extension line segments EXQ5, NXQ5, SXQ4, and WXQ5 from mux arrays four tiles away to the east, north, south, and west, respectively. Refer to FIG. 4b for a full illustration of quad-length lines ending in line segments NXQ5, SXQ4, and WXQ5.

Figure 5D:
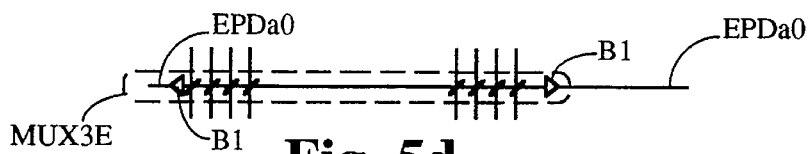
FIGS. 5d–5g show detail of structures in FIG. 4b.
Figure 5E:
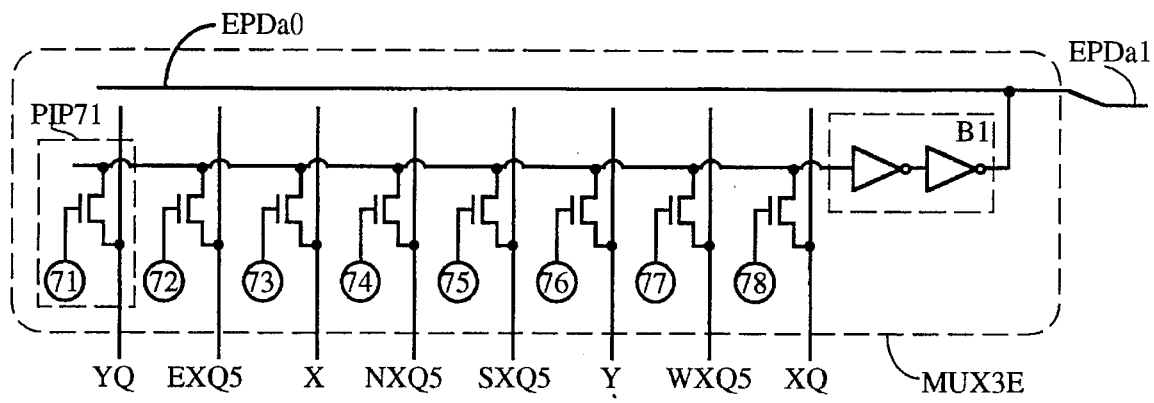

Multiplexers MUX3E, MUX4E, and MUX5E illustrated in FIG. 5b use unbuffered PIP connections as illustrated in the bottom row of FIG. 2, for example by circuit 37 or 38, followed by a buffer. FIGS. 5d and 5e illustrate these multiplexers in greater detail. A symbolic representation of multiplexer MUX3E is illustrated in FIG. 5d, and the actual circuit is illustrated in FIG. 5e. The eight vertical line segments YQ, EXQ5, X, NXQ5, SXQ5, Y, WXQ5, and SQ (which bear the same labels in earlier figures) are the eight input lines to multiplexer MUX3E. To provide sufficient drive, buffer B1, which in FIG. 5e is two inverters in series, drives segment EPDa0 and the remainder of line E1. FIGS. 5b and 5d show buffers B1 at both ends of the output line, because the output signal from the buffer B1 propagates in both directions on the conductive line or segment connected to the buffer output terminal. However, the circuit is not actually implemented with two buffers, as can be seen in FIG. 5e. Multiplexers MUX4E and MUX5E are implemented with equivalent structures. Each multiplexer output buffer B1 drives approximately the same load or the same number of PIPs. Driving approximately the same number of buffered PIPs with multiplexers MUX3E, MUX4E and MUX5E of FIG. 5b ensures that signals will arrive at their respective destinations at approximately the same time. Since the signal output by MUX3E, MUX4E or MUX5E has just been buffered, this buffered signal provides sufficient drive that extension multiplexers MUX6E and MUX7E may be unbuffered.

Figure 5F:
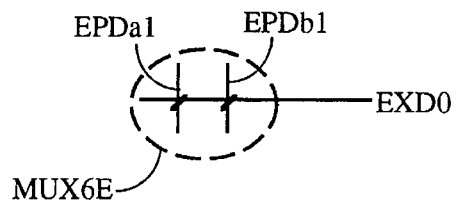
Figure 5G:
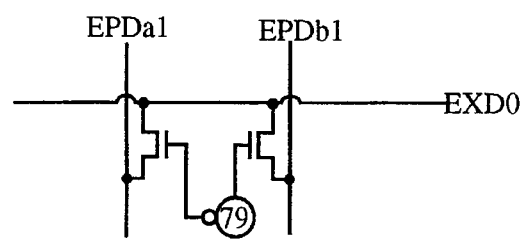

FIG. 5f shows multiplexer MUX6E with its two input lines EPDa1 and EPDb1, and two unbuffered PIPs which drive output segment EXD0. One circuit for implementing multiplexer MUX6E is shown in FIG. 5g. A single memory cell 79 causes one and only one of lines EPDa1 and EPDb1 to be connected to extension segment EXD0. Multiplexer MUX7E may use the same structure. However, multiplexers MUX6E and MUX7E may also be implemented using buffered connectors.

Referring to FIGS. 5a, 5b, and 6a, some output lines extend two tiles east and some extend four tiles east. For example the output line E1 from multiplexer MUX3E extends two tiles east and comprises line segments 51 and 52. Output line E3 from multiplexer MUX5E extends four tiles east and comprises segments 58–61. Note particularly line segments 56 and 57. In FIG. 5b, at the right edge of the figure, line segment 56 connects at the tile boundary to line segment 57 and also through a hard connection (solid black dot) provides input to multiplexer MUX7E. Thus segment 57 extends line E4 somewhat more than two tiles long. Similarly, the quad-length line E5 comprising segments 62–66 is somewhat more than four tiles long.

In FIGS. 4a and 4b, each output line from a multiplexer in mux array MA drives 24 to 28 buffered PIPs. For example, in FIG. 4a, the output line comprising segments EPDa0 and EPDa1 drives 12 PIPs in each of PIP arrays PAN and PAS and also drives vertical long line VLL7 and the input line to tristate buffer A. It is desirable that only one long line, in this case VLL7, be driven by a multiplexer output line because the buffered PIPs which drive long lines are much larger than PIPs in the PIP arrays, and having a large number of long line PIPs would cause a significant increase in delay.

Extension multiplexers MUX6E and MUX7E extend the signal provided by mux array MA909 (FIG. 6a) for a length of eventually eight tiles, i.e. to mux array MA917 of tile T917 if extension multiplexers MUX6E and MUX7E are carrying that signal. In this case, since extension multiplexers MUX6E and MUX7E are unbuffered, the appropriate one of multiplexers MUX3E, MUX4E, or MUX5E drives 8 unbuffered PIPs, each of which provides an input signal to 8 multiplexers in the next mux array MA913 or MA917 reached by extension multiplexer MUX6E or MUX7E in addition to the 26 buffered PIPs. This causes a slight increase in delay when an extension line is being used. However, in a preferred embodiment, the increase is not significant because the eight unbuffered PIPs providing input signals to eight multiplexers, are laid out such that an output line such as E1 drives only four small source or drain diffusion areas and the capacitance of these four diffusion areas is small compared to the capacitance of the 24–28 gates in the buffered PIPs plus capacitance of the metal lines which are always driven by a multiplexer output line. In the embodiment of FIGS. 4a and 4b, a buffer thus drives in the range of 24 to 32 load devices. Since one of these load devices is a large long line drive transistor, the range of delay for signals driven by a multiplexer buffer varies by only about 20%.

Thus the delay caused by placing a signal on any output line from mux array MA909 is approximately the same, regardless of the line length and regardless of whether the extension multiplexers are used.

FIG. 4a also includes lines which carry signals specific to the synchronous portion of the CLE, i.e. a clock line K, a set/reset line S/R, an asynchronous set/reset line ASR, a parallel enable line PE and a clock enable line $\overline{CE}$. These set/reset, parallel enable and chip enable lines are all global lines which extend to every CLE in the entire FPGA chip.

The clock line K may be driven either by a global signal or by a locally derived signal, as programmed by the user. Sources for clock signal K include multiplexer output signals which can be seen by examining the positions of PIPs in FIGS. 4a and 4b. Additionally, clock signal K may be derived from a vertical line such as VG0 through VG3 in FIG. 4a.

Also shown in FIG. 4a are additional lines which are useful in an actual product. These include horizontal long lines HLL0 through HLL7 and vertical long lines VLL0 through VLL7 for interconnecting widely distant portions of the FPGA. Buffered PIPs allow output signals from mux array MA to be placed onto these horizontal and vertical long lines. Note that only one PIP is provided for applying each of the mux array output signals to a corresponding vertical or horizontal long line. The tile of FIGS. 4a and 4b is typically one of many tiles, for example part of a sixteen by sixteen array. In one embodiment, these long lines have equivalent connections in other tiles through at least half the length of the entire chip. Thus, it is preferred to minimize the number of PIPs which drive these long lines in order to minimize long line propagation delay.

Horizontal bus lines HTL0 and HTL1 can be driven by tristatable buffers A and B which are controlled by vertical tristate control line VTC. Input signals to tristate buffers A and B may be derived from, for example, line segment SPDa0 or SPDa1 extending vertically in FIG. 4b or by one of the additional sources for these tristate buffer input signals illustrated in FIGS. 4a and 4b.

FIGS. 6b and 6c show some of the connectivity which occurs when tiles having the structure of FIGS. 4a and 4b are joined. FIGS. 6b and 6c differ from the preferred embodiment in FIGS. 4a and 4b by not illustrating all input lines to the respective CLEs and their associated PIPs. FIG. 6b shows one mux array MA909 and some of the CLE input lines which it can drive through just one PIP. Because of the number of signal lines physically close together in FIG. 6b, few labels have been attached to the elements near the center of the picture. However, tile T909 and mux array MA909 near the center of the figure are labeled. Surrounding mux array MA909 at four corners are the four CLEs C909, C910, C1009, and C1010 (see FIG. 6c) which were shown and labeled in FIG. 6a but are unlabeled in FIG. 6b. Output lines from mux array MA909 extend in four directions, and are shown to connect mux array MA909 to four mux arrays MA913 to the east, MA905 to the west, MA509 to the north, and MA1309 to the south, which are each four tiles away from mux array MA909. Further extension multiplexers MUX7E, MUX7W, MUX7N and MUX7S allow mux array MA909 to send a signal eight tiles away to mux array MA917 to the east, MA901 to the west, MA109 to the north, and MA1709 to the south, which are each eight tiles away from mux array MA909. This signal sent eight tiles away uses a conductive path which must pass through only one transistor if the signal passes through one extension multiplexer such as MUX7E or two transistors if the signal passes through two extension multiplexers such as MUX6E and MUX7E.

Also illustrated in FIG. 6b are CLEs which can be accessed by mux array MA909 through only one PIP. The portion of FIG. 6b marked by a dashed line labeled FIG. 6c is illustrated in more detail in FIG. 6c. As illustrated in FIG. 6c, if a user wants to apply an output signal from mux array MA909 to CLE C1010, for example, there are six different output lines from mux array MA909 which can be used, lines E1, E2, W1, W2, S1 and S2. (Lines W1 and W2 extend through mux array MA909, and the PIPs for accessing CLE C1010 are at the east ends of lines W1 and W2 to the right of mux array MA909.) PIPs are provided for connecting lines E1, E2, W1, and W2 to input line 1010S of CLE C1010. PIPs are provided for connecting lines S1 and S2 to input line 1010E of CLE C1010. As distance from mux array MA909 increases, fewer PIPs are provided. For example, if a user wants to apply an output signal from mux array MA909 to CLE C1111, there are three different output lines from mux array MA909 which can be used, E1, E2, and S3, since PIPs are provided to connect lines E1 and E2 to input line 1111S of CLE C1111 and to connect line S3 to input line 1111E of CLE C1111. And further away, CLE C1113 can be accessed by mux array MA909 on only one line E3 through one PIP to input line 1113S of CLE C1113.

As illustrated in FIG. 6c, each output line from mux array MA909 accesses eight PIPs. Output line E1 accesses four PIPs in tile T909 and four PIPs in tile T910. Output line E2 has the same arrangement. Output lines E1 and E2 each access CLEs C809, C909, C1110 and C1010 through PIPs in tile T909 and CLEs C910, C810, C1111 and C1011 through PIPs in tile T910. Output line E3 accesses CLEs C911, C811, C1112 and C1012 through PIPs in tile T911 and accesses CLEs C912, C812, C1113, and C1013 through PIPs in tile T912. Similar arrangements are provided for the north, south, and west output lines. (FIG. 6c does not show all CLE input lines available in the embodiment of FIGS. 4a and 4b. In that embodiment each output line accesses 24 PIPs which in turn access respective CLE input lines, as well as PIPs which in turn drive other structures such as long lines extending through many tiles.)

FIG. 7 provides yet another illustration of the connectivity offered by the mux array of FIGS. 4a and 4b. As illustrated in FIG. 4b, mux array MA receives twelve input signals on twelve input lines and comprises twelve multiplexers.

Each multiplexer selects an input signal from eight of the twelve input lines, as was discussed above in connection with FIG. 4b. FIG. 7 illustrates structures outside mux array MA of FIG. 4b including the twelve input lines and twelve output lines. Labels in FIG. 7 correspond to those of FIGS. 5a–6c. Input line I5-4 of mux array MA909 is output line E4 from mux array MA905 four tiles to the west. Input line I5-8 is output line E5 from mux array MA901 eight tiles to the west. Similarly, input line I6-4 is output line W4 from mux array MA913 four tiles to the east, and input line I6-8 is output line W5 from mux array MA917 eight tiles to the east. Likewise, input line I7-4 is output line S4 from mux array MA509 four tiles to the north and input line I7-8 is output line S5 from mux array MA109 eight tiles to the north. Finally, input line I8-4 is output line N4 coming from mux array MA1309 four tiles to the south and input line I8-8 is output line N5 from mux array MA1709 eight tiles to the south.

As was discussed in connection with FIG. 4b, the 12 multiplexers in mux array MA909 each select from eight of the 12 input signals to drive one output line: three eastbound lines E1, E2, and E3, three westbound lines W1, W2, and W3, three northbound lines N1, N2, and N3, and three southbound output lines S1, S2, and S3. Thus, each mux array in this embodiment of the invention may be programmed to allow any one of four nearby CLE output lines, or four of the eight mux array output lines to connect to selected ones of its 12 mux array output lines, in this case the 12 output lines originating from mux array MA909.

Output Lines

The following output lines in FIG. 7 have a length of two tiles: E1, E2, E4, W1, W2, W4, N1, N2, N4, S1, S2, and S4;

and the following lines have a length of four tiles in this embodiment of the invention: E3, E5, W3, W5, N3, N5, S3, and S5. The PIP connections decrease as the distance from the source mux array increases. The output lines directly originating from the mux array have a substantially balanced programmable switch load. Also, mux array output lines are coupled to other mux array output lines to provide extension capability.

Extension Multiplexers

The following discussion describes the extension multiplexers for the eastbound mux array output lines. This description is identically applicable to extension muxes used with the north, south, and west lines. Multiplexer MUX6E couples one of lines E1 and E2 to line E4, as programmed, while multiplexer MUX7E couples one of lines E3 and E4 to line E5. Because lines E4 and E5 are coupled to the driving means in the mux array through a pass transistor, they have no buffer to assist in reducing the resistive-capacitive delay incurred on signal paths using these lines. These lines are used mainly for extending the routing to remote tile locations. In the preferred embodiment shown in FIG. 5g, one or the other input line to extension multiplexer MUX6E is always connected to extension segment EXD0 and thus to extension line E4. The same is true for multiplexer MUX7E.

PIP Array

The PIP array for this embodiment of the invention is similar to that of FIG. 1b. Each small circle in FIG. 7 represents a pip array having 12 PIPs, each connecting to a CLE input line. Each CLE has 12 input lines, each input line having a length of two tiles (see FIG. 4a). Three of the input lines extend east, three west, three north, and three south. For horizontal output line E1 in FIG. 7, the 12 PIPs connect to three input lines F1, C1, and G1 to the CLE located in the same tile, three input lines F1, C1, G1 to the CLE located one tile to the north, three input lines F3, G3, and C3 to the CLE located one tile to the southeast, and three input lines F3, C3, G3 to the CLE located south southeast. For vertical output line N1, the two PIP arrays each connect to three input lines to the CLE located in the same tile, three input lines to the CLE located one tile to the east, three input lines to the CLE located one tile to the west, and three input lines to the CLE located two tiles to the east. The general distribution of these CLE connections can be understood by viewing FIG. 6b, although FIG. 6b does not show all CLE input lines accessed in the embodiment of FIGS. 4a and 4b.

Configurable Logic Element CIE

Figure 8A:
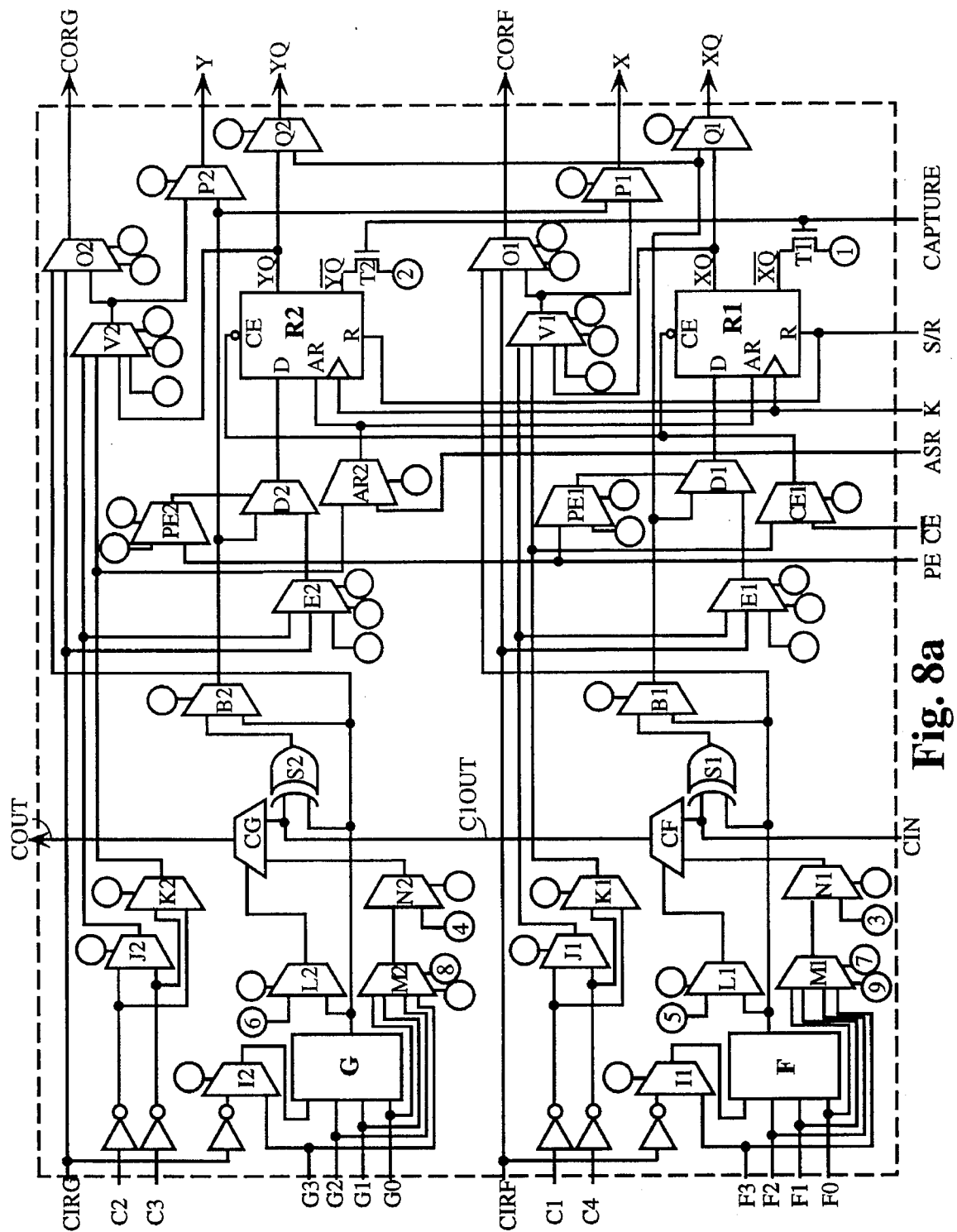
FIG. 8a illustrates one embodiment of a CLE used in conjunction with the invention.
Figure 8B:
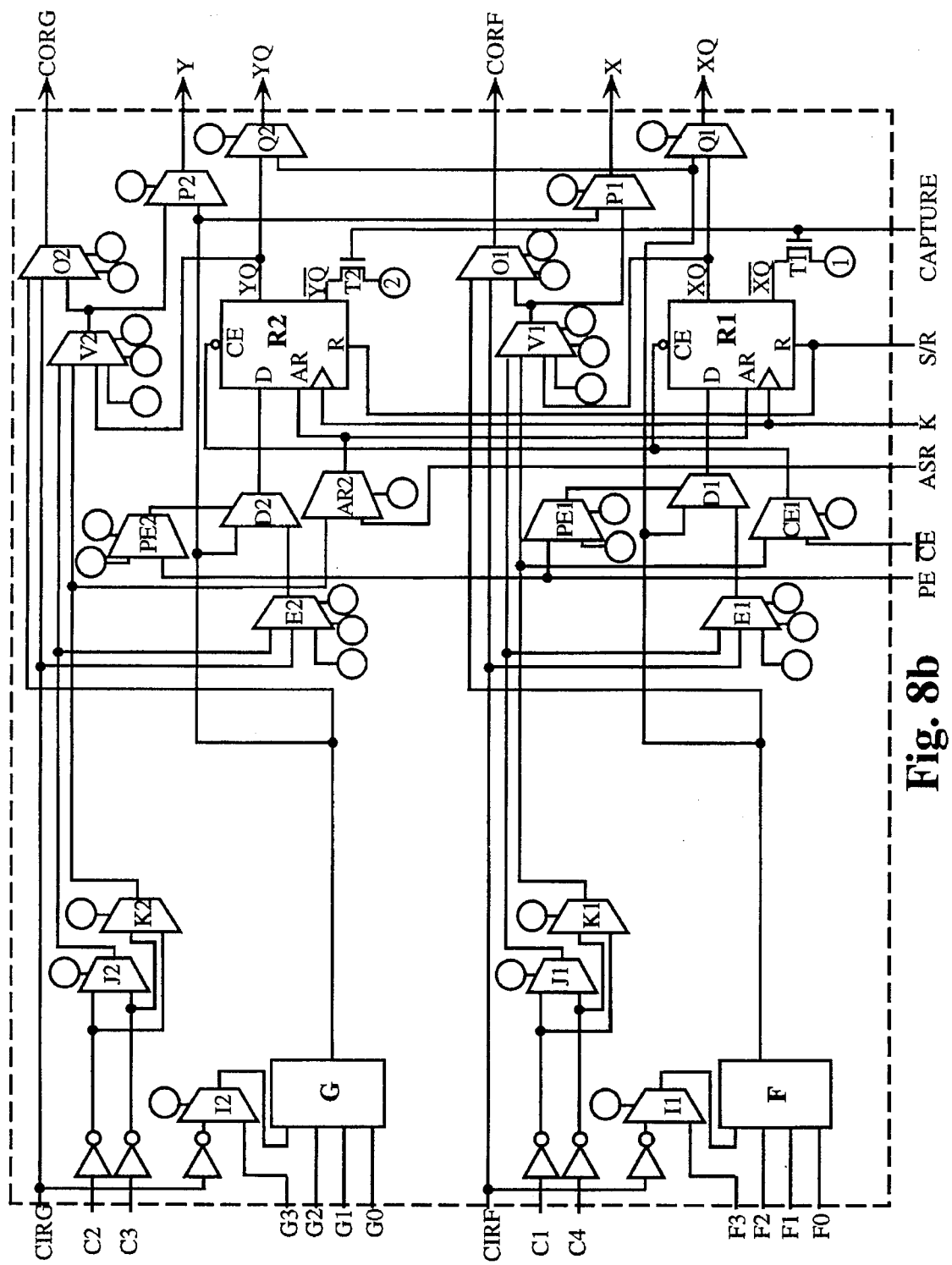
FIG. 8b illustrates another embodiment of a CLE which can be used with the invention when a carry chain is not provided.

FIG. 8a illustrates a configurable logic element usable with the invention. FIG. 8a simply represents the interior structure of the CLE illustrated in FIG. 4a. Input and output line numbers in FIG. 8a are the same as those indicated in FIGS. 4a and 4b as CLE input and output lines. Configuration memory cells which control multiplexers or provide constant input signals to multiplexers are represented by circles. Two function generators F and G also include configuration memory cells, 16 memory cells in each of function generators F and G, and each function generator receive four input signals which select one of the 16 stored values to provide as the function generator output signal. Thus, each function generator provides any function of the input signals. These function generator input signals are from lines F1, F2, F3, F4 for the F function generator and G1, G2, G3 and G4 for the G function generator. Signals on the F1 and G1 lines however are multiplexed with a cascade-in signal CIRF or CIRG, each of which is a direct output signal CORF or CORG from the neighboring CLE (see relationship to neighboring CLE in FIGS. 4a and 4b).

To implement an arithmetic function, one bit is handled in each of the function generators. Multiplexers N1 and N2 are set to forward the values from M1 and M2 to input terminals of carry multiplexers CF and CG. Similarly, multiplexers L1 and L2 are set to forward the outputs of function generators F and G to the control terminals of carry multiplexers CF and CG.

Multiplexers L1, L2, M1, M2, N1, and N2 offer additional functionality in use of the carry multiplexers CF and CG. Multiplexers L1 and L2 can be set to provide a constant value stored in memory cells 5 and 6. The value stored in cell 5 or 6 can cause carry multiplexer CF or CG to select the output of multiplexer N1 or N2. When multiplexers N1 and N2 are set to provide a constant value 1 from cells 3 and 4, carry multiplexers CF and CG provide the OR function of the carry-in signal and the value from multiplexers L1 and L2. When multiplexers N1 and N2 are set to provide a constant value 0 from cells 3 and 4, carry multiplexers CF and CG provide the AND function of the carry-in signal and the value from multiplexers L1 and L2. Thus wide AND or wide OR functions can easily be generated. Multiplexers M1 and M2 select one of the input signals to the F and G function generators to apply as an input signal to multiplexers N1 and N2 respectively. Memory cells 7 and 9 control multiplexer M1 and memory cells 8 and 10 control multiplexer M2. Thus the following functions can be generated by the multiplexers of FIG. 8a while other functions are being simultaneously generated in the F and G function generators:

$C_{i+1}=0$ $C_{i+1}=1$ $C_{i+1}=A_i$ $C_{i+1}=C_i$ $C_{i+1}=C_i$ AND $F_i$ $C_{i+1}=C_i$ OR $\bar{F}_i$ Adder operation where the suffix i+1 refers to the next highest bit from the suffix i in a carry chain.

Note that whereas the carry chain extends vertically through the CLE and vertically through the chip to other CLEs, the CLE of FIG. 8a also includes a horizontally extending cascade chain for accessing both a function generator and a register in each CLE. The F cascade-in line CIRF provides an input signal to the F function generator through multiplexer I1 and to the related register R1 through multiplexers E1 and D1. The F cascade-out line CORF can be driven by the cascade in line CIRF, by the F function generator, by register R1, by a constant, or by line C1 or C4 as selected by related multiplexers O1, V1, J1 and K1. Lines CIRG and CORG are similarly connected. These cascade lines allow functions of more than 4 inputs to be implemented with better timing than if inputs were joined through mux arrays.

It can be seen in FIG. 8a that multiplexers L1 and L2 allow carry multiplexers CF and CG to be used for skipping and initialization while the function generators are used for other purposes. Multiplexers N1 and N2 allow initialization and logic functions without using up one of the function generator input signals and the routing thereto (not shown, positioned to the left of the figure, for example).

Multiplexers in the CLE of FIG. 8a allow the user flexibility in routing signals through the CLE. Also included are flip flops R1 and R2 which provide registered output signals. The routing multiplexers provide that many choices of signals derived from the function generators, flip flops, and other multiplexers can in turn be provided as output signals on lines X, Y, XQ, YQ, CORF and CORG.

Another embodiment similar to FIG. 8a includes a fifth input to the structure comprising multiplexers M1 and N1 (and their equivalents M2 and N2). If desired, the fifth signal is provided as the output of N1. This embodiment has the advantage that the functions listed above can be implemented by multiplexers while the related function generator F is able to simultaneously implement any function of the four input signals F1–F4 which it receives. The CLE of FIG. 8a is further described by New and Pierce in copending U.S. patent application Ser. No. 08/310,113.

Edge Tiles

When an FPGA chip is to be made using the invention, edge tiles must also be provided to interface with external pins and pads and to complete the connectivity of the tile structure. FIGS. 9a through 15 show detail of some preferred embodiments of the edge tiles and overall connectivity which results when a set of tiles is joined. FIG. 15 shows the overview of an FPGA chip. In the core of the chip a plurality of tiles as illustrated in FIGS. 4a and 4b are placed. Tiles numbered 155 and 156 represent structures which are different from those illustrated in FIGS. 4a and 4b. For example RAM structures may be placed in some of the tile locations, such as those labeled 155–158 and accessed through the cascade-in lines CIRF, and CIRG and cascade-out lines CORF, and CORG illustrated in FIG. 4a, also FIG. 8a.

In FIG. 15, to the west of the core region including tiles labeled FIGS. 4a and 4b are west tiles labeled FIGS. 9a and 9b. One of these west tiles is illustrated in FIGS. 9a and 9b. And to the west of this west tile is the west edge tile illustrated in FIG. 11.

Figure 16:
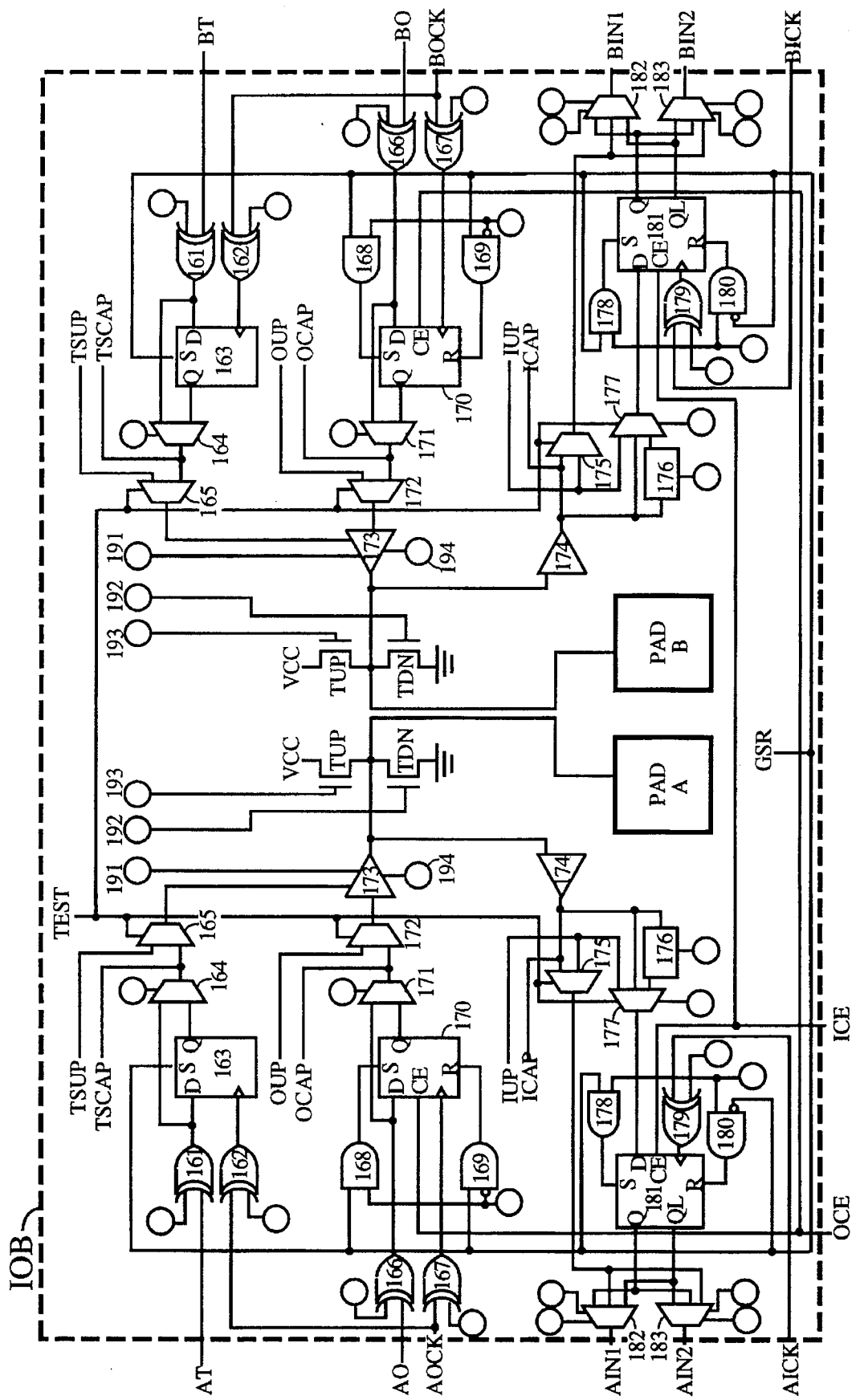
FIG. 16 illustrates one embodiment of an input/output block used in conjunction with the invention.

In FIG. 9a, instead of the CLE of FIG. 4a, the tile includes an input/output block IOB. Input/output block IOB communicates with two external pads (and pins). This IOB is illustrated in FIG. 16 and discussed below. In FIG. 9a pullup resistors can be programmed to connect horizontal tristate lines HTL0 and HTL1 to a positive voltage supply when these lines would otherwise be left floating.

In FIG. 9b, horizontal long lines HLL0 through HLL7 can each be driven by a vertically extending line as discussed in connection with FIG. 4b. No west driving PIP array PAW is provided since no core tile exists to the west of the west tile of FIGS. 9a and 9b. A-pad input line AIN2 and B-pad input line BIN2 from input/output block IOB replace lines YQ and X of FIG. 4b. Except for these differences, FIGS. 9a and 9b are like FIGS. 4a and 4b.

Likewise, the north tile of FIGS. 10a and 10b is similar to a core tile of FIGS. 4a and 4b. Again, in FIG. 10a, the CLE of FIG. 4a is replaced by an IOB and no north extending PIP array PAN is provided. Therefore, in FIGS. 10a and 10b, input and output signals from the IOB are different from the signals from the CLE of FIGS. 4a and 4b.

Wrap Around at Edges

Figure 12:
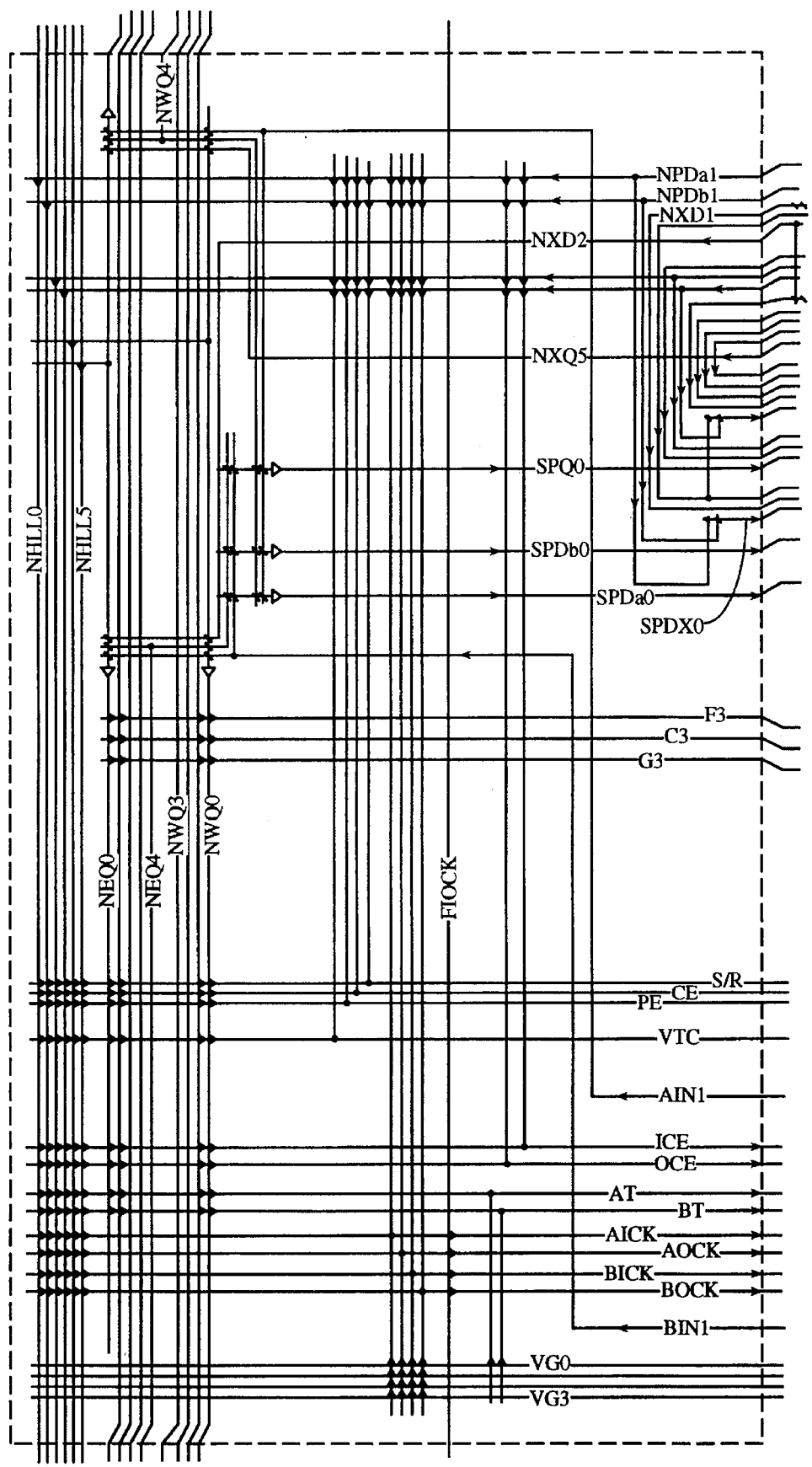
FIG. 12 illustrates a north edge tile usable with the embodiment of FIGS. 4a and 4b.
Figure 13:
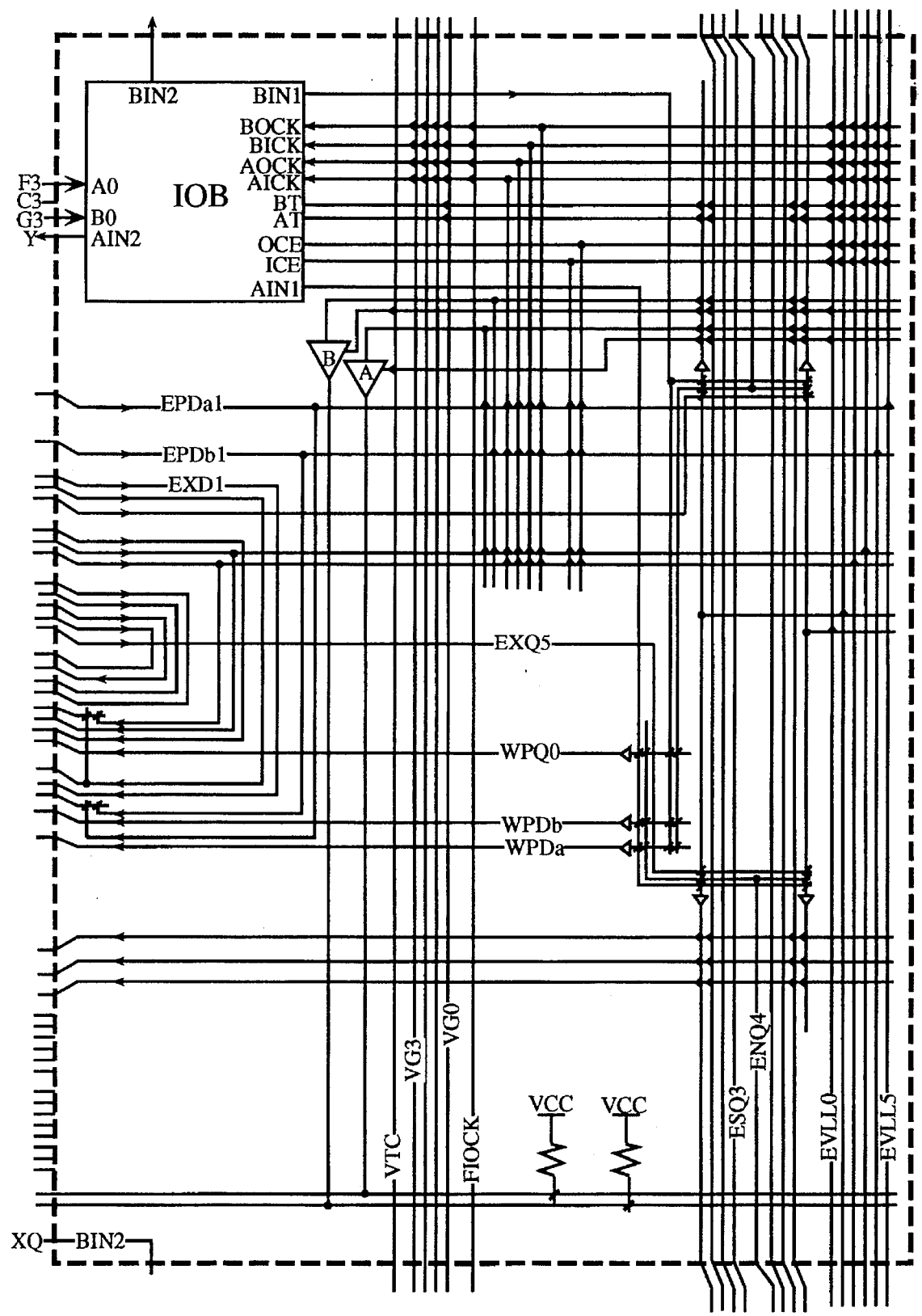
FIG. 13 illustrates an east edge tile usable with the embodiment of FIGS. 4a and 4b.
Figure 14:
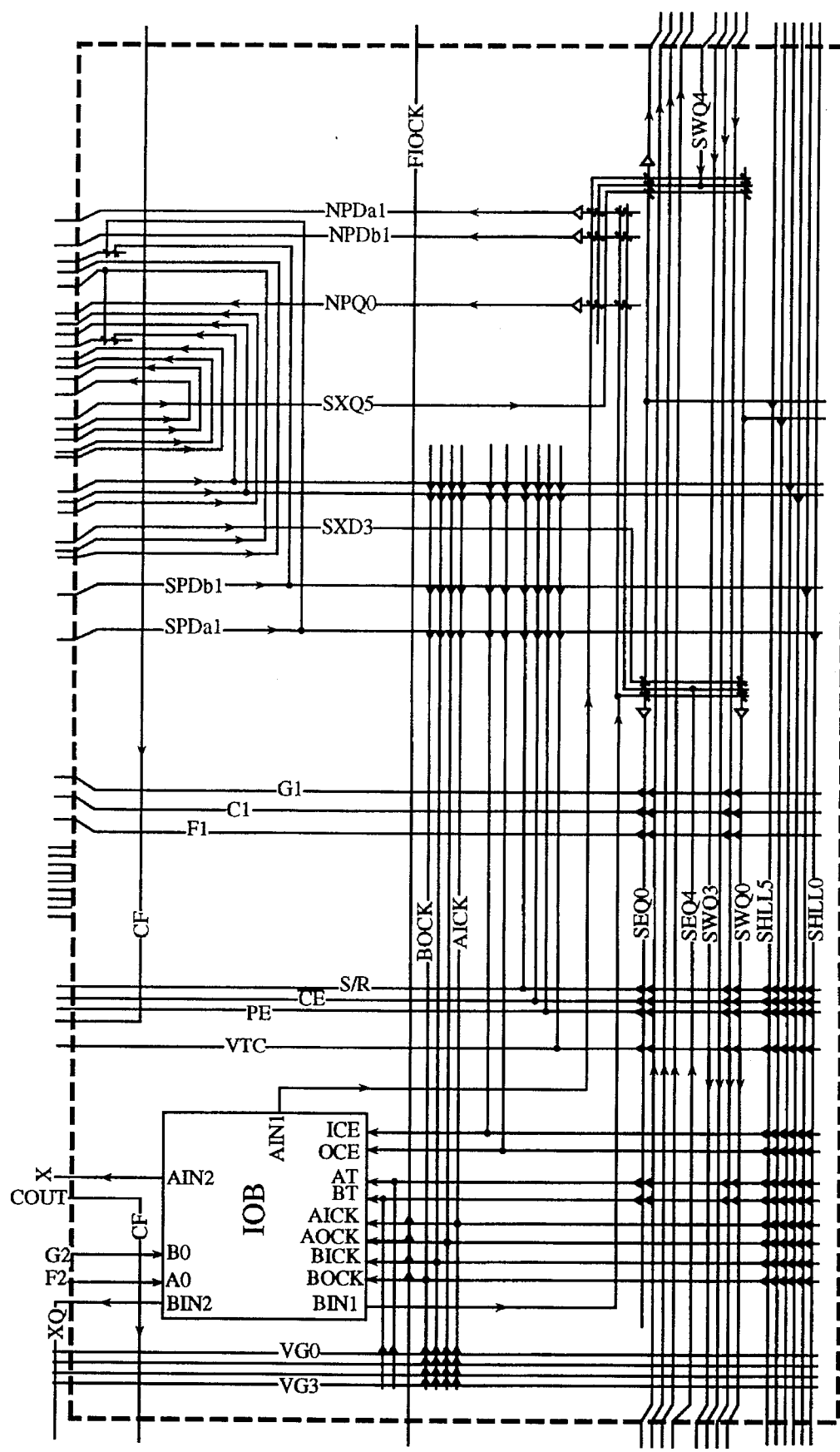
FIG. 14 illustrates a south edge tile usable with the embodiment of FIGS. 4a and 4b.

Four edge tiles are illustrated in FIGS. 11 through 14. FIG. 11 illustrates a west edge tile which provides routing lines and PIPs, and also includes a wrap around feature which allows lines extending west from a core tile to be used for routing signals to the east. With this wrap around feature, there is no loss of routing flexibility near the edge of the chip. Other routing lines in edge tile of FIG. 11 also improve the flexibility of routing near the edge of the array. Similar structures are illustrated in FIGS. 12–14 for providing extra routing lines and the wrap around feature.

Timing Maintained at Edges

The number of PIPs attached to lines extending into the edge tiles has been selected so as to maintain the same loads on lines extending into the edges of the chip, and thus the edges maintain approximately the same timing as is present in the core of a chip.

Carry Signal Wrapping

Looking at FIGS. 4a, 10a and 14 together, one can also see a wrapping feature for the carry signal. The carry-out line COUT of FIG. 4a moves south through successive tiles until reaching the south edge tile of FIG. 14. Here, the COUT line turns west and becomes the carry-forward line CF. In the next tile west, FIG. 14 illustrates that this carry forward line CF extends west and then turns north. Looking again at FIG. 4a, the CF line can again be seen carrying the signal north. In the north tile, as shown in FIG. 10a, the north going carry forward line CF turns west and then south where it becomes the carry-in line CIN to the next tile south. Thus a carry chain is maintained from one column to the next. Furthermore, the carry chain progresses in the same direction (from top to bottom in this case) in every column, so the software can place logic functions which use the carry feature into the device more easily.

Corner Tiles

FIG. 15 illustrates four corner tiles numbered 151–154. These corner tiles cooperate with the adjacent tiles to provide a connected structure. Typically, corner tiles provide global functions including a clock oscillator and dividers, one or more configuration lines and pins for receiving a configuration bit stream and loading memory cells in the chip, a reset control structure, and other startup control structures. These corner structures are known from other FPGA devices available in the market and are not again described herein.

Input/Output Block

FIG. 16 illustrates an input/output block IOB usable with the invention. The IOB includes two pads PAD A and PAD B for connecting to external pins of the chip. Each pad can serve as an input pad or an output pad as established by the memory cells (represented as circles) which are part of the configuration memory of the chip. The left portion of FIG. 16 relates to PAD A and the right portion to PAD B. Signal lines which extend outside the border of the IOB have names which correspond to those in FIGS. 9a, 10a, 13, and 14.

The upper left portion of FIG. 16 provides output control of PAD A when used as an output pad. Buffer 173 is a tristate buffer and is turned on only when PAD A is an output pad. Memory cell 191 controls the slew rate of buffer 173, and memory cell 194 controls the capacitive/resistive response of buffer 173. This buffer is described more completely by Pierce and Carpenter in U.S. Pat. No. 5,319,252 which is incorporated by reference. Multiplexer 165 controls whether buffer 173 is in a tristate (high impedance, for input) mode or whether buffer 173 drives the output signal from multiplexer 172 to PAD A (output mode). Multiplexer 171 can provide a registered signal from register 170 or an asynchronous signal to multiplexer 172. The registered or asynchronous signal provided by multiplexer 171 is the A output signal AO as forwarded or inverted by XOR gate 166. The registered signal is stored in response to the output clock signal AOCK which is either inverted or not by XOR gate 167 in response to its related memory cell. The GSR line provides a global set/reset signal to all IOBs in the chip. Register 170 is either set or reset by global set/reset line GSR as determined by a memory cell which controls AND gates 168 and 169. Also available as output signals are a constant high and a constant low signal as provided by pullup transistor TUP and pulldown transistor TDN under control of memory cells 193 and 192.

The lower left portion of FIG. 16 is input circuitry used when PAD A is an input pad. Buffer 174 can provide an asynchronous input signal through multiplexer 175 to input multiplexers 182 and 183 which provide input signals AIN1 and AIN2. The input signal on PAD A can also be stored in register 181 under control of input clock signal AICK which may be inverted or not by XOR gate 179. The clock input to register 181 is enabled by input clock enable line ICE. Register 181 is set or reset by global set/reset line GSR as determined by a memory cell which controls AND gates 178 and 180. The two input signals AIN1 and AIN2 from PAD A can thus be derived asynchronously from buffer 174 as driven by PAD A, or synchronously as driven by either the Q output of register 181 or the QL (latch) output of register 181. Register 181 offers as output signals both the Q output signal from the slave latch of the register flip flop and the QL output signal from the master latch of the flip flop. Thus register 181 can act as a latch or a flip flop.

Also provided in the IOB of FIG. 16 is delay unit 176 (for example a series string of inverters each having intrinsic capacitance). It is sometimes desirable to delay a signal provided on an external pad such as PAD A when the signal will be provided to a register controlled by a global clock slightly delayed from the signal on the input pad. Delay unit 176 is controlled by a memory cell which selects between two amounts of delay. Multiplexer 177 in operating mode is controlled by its related memory cell to either provide the delayed signal from delay unit 176 or the direct signal buffered by buffer 174 from PAD A. In a test mode, the TEST control signal causes multiplexers 175 and 177 to forward the signal on line IUP to one or both input lines AIN1 and AIN2 (as determined by multiplexers 182 and 183) and also to provide the IUP signal to the D input of register 181.

Another feature is provided in FIG. 16, namely the ability to capture and update signals to and from the chip. Lines TSUP, TSCAP, OUP, OCAP, ICAP and IUP provide this ability. Lines TSCAP, OCAP, and ICAP are used to capture the tristate control signal, output signal, and input signal which are present on the respective lines. Line OCAP can capture either the registered Q output signal from register 170 or the AO output signal from XOR gate 166, whichever is forwarded by multiplexer 171. Line TSCAP captures the tristate control signal provided on line AT and either inverted or forwarded by XOR gate 161. The signal captured by line TSCAP is either registered or asynchronous as determined by multiplexer 164. Line ICAP can capture the buffered signal from PAD A. These captured signals are useful when debugging or testing a design. If it is desired to override a part of the circuit during testing, lines TSUP, OUP, and IUP can be used to apply a signal to a respective point in the circuit, a feature also useful for testing and debugging.

The right portion of FIG. 16 functions in the same manner for PAD B and thus can be understood from symmetry.

Figure 17:
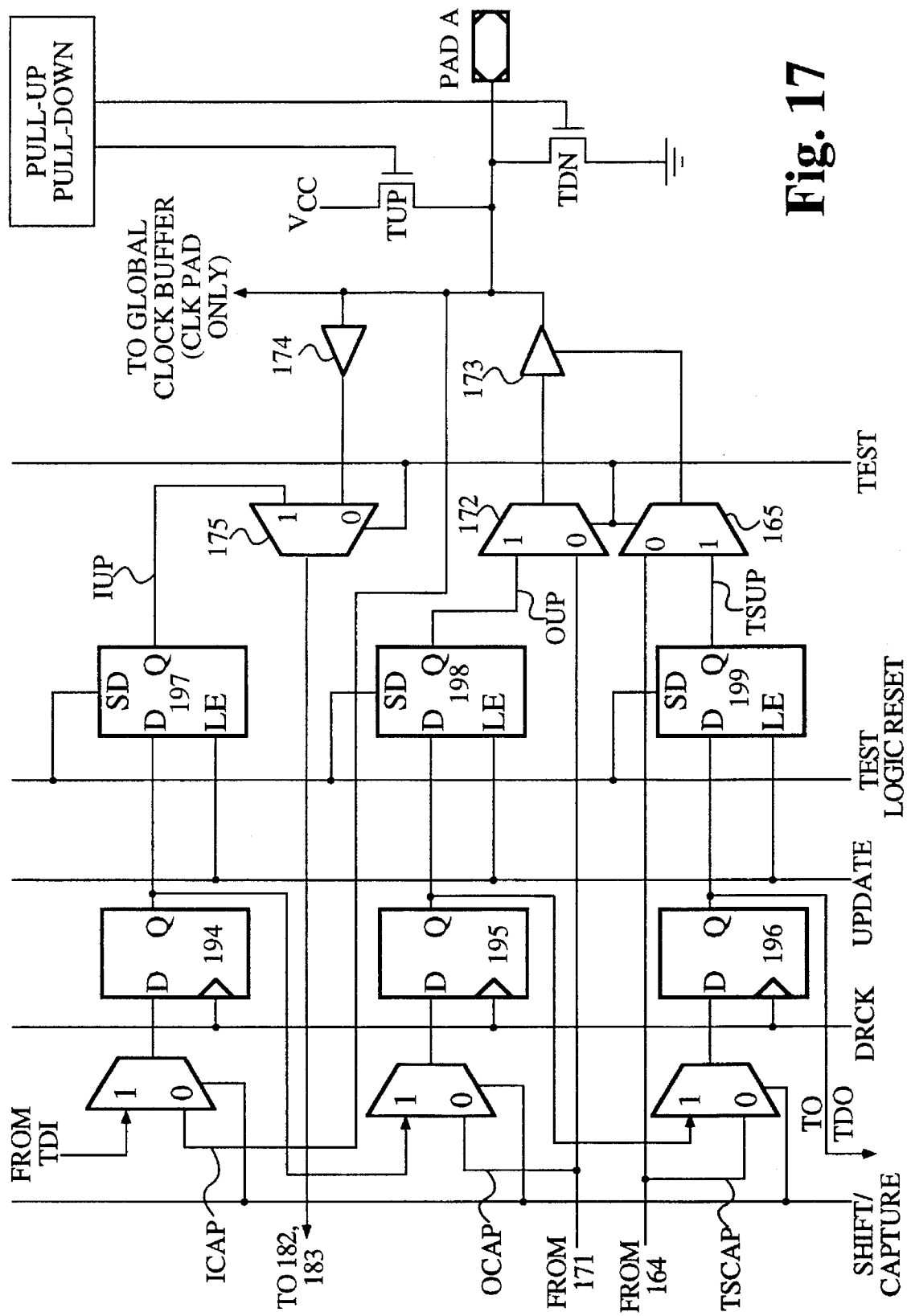
FIG. 17 shows a boundary scan structure used with the input/output block of FIG. 16.

FIG. 17 illustrates part of a boundary scan structure which extends around the perimeter of the chip for scanning data into and out of registers in the IOBs. Registers 194–196 form part of a shift register extending around the perimeter. Four pins allow data to be read into and out of this shift register. Such a structure is described further on pages 8-46 through 8-52 of *The Programmable Logic Data Book*, ©1994, available from Xilinx, Inc. at 2100 Logic Drive, San Jose, Calif. 95124, incorporated herein by reference. Data shifted into the shift register from test data in line TDI are transferred to registers such as 197–199 in response to a global Update signal and become the update signals IUP, OUP, and TSUP applied to multiplexers 175, 172, and 165 respectively (shown in both FIGS. 16 and 17). A high TEST signal causes these signals to be applied to input multiplexers 182, 183 (FIG. 16), output multiplexer 172, and output tristate control multiplexer 165, thus overriding signals provided by the chip. Similarly, data which have been generated by the chip can be captured through the same shift register by applying a capture signal to the Shift/Capture line, which causes data on PAD A, output register 170 and tristate control register 163 to be captured into registers 194, 195, and 196 where it can then be shifted out on line TDO. The UP signals come from an update register (not shown) and the CAP signals are stored in a capture register (not shown).

Summary

Although the invention is described herein with reference to a number of embodiments, one skilled in the art will readily appreciate that other embodiments may be substituted for those set forth herein without departing from the spirit and scope of the present invention. For one example, in alternating tiles the CLE of FIG. 8a can be replaced by the CLE of FIG. 8b which does not include the multiplexer structure including multiplexers L1, M1, N1, CF, B1, L2, M2, N2, CG, and B2, and XOR gates S1 and S2 for forming a carry chain, and thus the FPGA chip can be made smaller than an FPGA chip in which all tiles include the CLE of FIG. 8a. For another example, the CLE of FIG. 8a can be replaced by a plurality of tiles, each tile comprising a CLE and an interconnect structure, thus producing a hierarchically connected FPGA. For another example, the long lines illustrated in FIG. 4a can be implemented as a plurality of lines of more than one length so that larger devices having more tiles also have more and longer interconnect lines. For yet another example, the three input lines extending into a CLE, which are all two tiles long in the illustrated embodiments, may be of different lengths. In particular, input lines to a single CLE may be of more than one length, for example line F1 may be of a different length than line G1, thus achieving the greater flexibility discussed above with respect to output lines. The invention is set forth in the claims.

We claim:

1. A field programmable logic device comprising:
   a plurality of logic units, each logic unit connecting to:
      a plurality of output lines extending from said logic unit comprising at least a first output line and a second output line, said first output line being shorter than said second output line; and
      a plurality of input lines extending into said logic unit, each input line connected to said logic unit so as to provide an input signal to said logic unit; and
   a plurality of programmable interconnection points (PIPs), each PIP being programmable to connect one of said output lines to one of said input lines; and a multiplexer receiving input signals from a plurality of said output lines and placing a signal from a selected one of said output lines onto an extension line extending in the same direction as one of said output lines, said extension line serving as a further input line to one of said logic units.

2. A field programmable logic device as in claim 1 in which one of said PIPs connects an output line from a first logic unit to an input line of a second logic unit.

3. A field programmable logic device as in claim 1 in which one of said PIPs connects an output line from a first logic unit to an input line of said first logic unit.

4. A field programmable logic device as in claim 1 in which said logic unit, output lines, input lines and PIPs are laid out in repeatable tiles, each tile including output lines, input lines, PIPs, and all portions of said logic unit, such that when a plurality of tiles is placed adjacent to each other, said field programmable logic device is formed.

5. A field programmable logic device as in claim 1 in which said first and second output lines include one output line two tiles long and one output line four tiles long.

6. A field programmable logic device as in claim 1 in which said input lines are two tiles long.

7. A field programmable logic device as in claim 1 in which said output lines comprise at least two output lines extending in each of a plurality of compass directions, the two lines in one compass direction being of unequal lengths.

8. A field programmable logic device as in claim 1 in which said first and second output lines connect to the same number of PIPs.

9. A field programmable logic device as in claim 1 in which PIPs are placed on an output line such that the number of PIPs in one tile portion of an output line decrease as distance from said logic unit increases.

10. A field programmable logic device as in claim 1 in which said first and second output lines connect to a set of PIPs sized and of a number such that the capacitive loads of said first and second output lines are approximately the same.

11. A field programmable logic device as in claim 1 in which each of said logic units comprises:

a logic element receiving some of said input lines for performing logical operations on signals received on said input lines, and providing an output therefrom;

a mux array driving some of said output lines; and at least one line which receives an output signal from said logic element and provides an input signal to said mux array, said mux array also receiving a signal from at least one other logic unit.

12. A field programmable logic device as in claim 1 in which some of said logic units comprise:

a logic element receiving some of said input lines for performing logical operations on signals received on said input lines, and providing an output. therefrom;

a mux array driving some of said output lines; and at least one line which receives an output signal from said logic element and provides an input signal to said mux array, said mux array also receiving a signal from at least one other logic unit;

and in which other of said logic units comprise:

a random access memory receiving signals on some of said input lines and supplying signals to some of said output lines.

13. A field programmable logic device as in claim 1 in which said PIP comprises a buffer having an input terminal connected to said output line and having an output terminal connected to a switch which programmably connects a buffer output signal to said input line.

14. A field programmable logic device as in claim 1 in which said PIP comprises a switch which programmably connects said one of said output lines to said one of said input lines.

15. A field programmable logic device comprising a plurality of identical adjacent tiles, each tile comprising:

a logic element having logic element input lines for providing input signals to said logic element, and a logic element output line for providing an output signal from said logic element;

an interconnect structure comprising:

a plurality of output segments which connect in adjacent tiles to form output lines, a first output line having a length differing from that of a second output line;

a plurality of input segments which connect in adjacent tiles to form input lines, each input line being a logic element output line from said logic element in said tile or from said logic element in another tile;

a mux array comprising a plurality of multiplexers, each programmable to connect one of a set of said input lines to an output line; and a plurality of PIPs, each PIP being programmable to connect one of said output lines to one of said logic element input lines.

16. A field programmable logic device as in claim 15 in which one of said output lines extending from a single mux array is of a different length from another of said output lines extending from said single mux array.

17. A field programmable logic device as in claim 16 in which some of said output segments connect to PIPs and some of said output segments do not connect to PIPs.

18. A field programmable logic device as in claim 15 in which some of said output lines connect to PIPs and some of said output lines do not connect to PIPs.

19. A field programmable logic device as in claim 15 in which said output lines each connect to a number of PIPs which causes all of said output lines to have substantially the same signal delay.

20. A field programmable logic device as in claim 15 in which the density of PIPs connected to said output lines decreases as distance from said mux array driving said output lines increases.

21. A field programmable logic device as in claim 15 in which at least one of said output lines can be coupled to an extension line which in turn carries an input signal from said one of said output lines to another mux array in another tile.

22. A field programmable logic device as in claim 21 in which said at least one of said output lines is coupled to said extension line through a single transistor.

23. A field programmable logic device as in claim 15 in which the density of PIPs connected to an output line decreases as distance from said mux array increases.

24. A field programmable logic device as in claim 15 in which at least one of said output lines can be coupled to an extension line which in turn carries a signal from said at least one of said output lines to another mux array in another tile.

25. An FPGA comprising:

a plurality of logic elements, each logic element receiving input signals from a plurality of input lines and providing at least one logic element output signal on a corresponding logic element output lead;

a plurality of mux arrays;

for each mux array:

a plurality of output lines including at least a first output line and a second output line, said first output line being of a length sufficiently different from length of said second output line as to extent past a different number of logic elements from said second output line;

for each output line in said mux array:
a plurality of programmable interconnection points (PIPs), which may be programmed to connect one of said logic element output leads to said output line; and
at least one programmable interconnection point (PIP) which may be programmed to connect said output line to one of said logic element input lines.

26. A programmable logic device comprising:
a plurality of configurable logic elements;
a plurality of multiplexer arrays; and
an interconnection network;
wherein:
one of said plurality of configurable logic elements, one of said plurality of multiplexer arrays, and a portion of said interconnection network form a tile,
said programmable logic device includes a plurality of said tiles, and
said interconnection network includes a plurality of lines of different, predetermined lengths, said plurality of lines including lines:
(a) providing a direct interconnection between one of said configurable logic elements and one of said multiplexer arrays;
(b) providing a direct interconnection between one of said multiplexer arrays and another multiplexer array;
(c) providing connection between one of said multiplexer arrays and a programmable interconnection point (PIP); and
(d) providing connection between one configurable logic element and another configurable logic element.

27. A field programmable logic device comprising a plurality of logic units, each logic unit connecting to:
a plurality of output lines extending from said logic unit comprising at least a first output line and a second output line, said first output line being shorter than said second output line;
a plurality of input lines extending into said logic unit, each input line connected to said logic unit so as to provide an input signal to said logic unit; and
a plurality of programmable interconnection points (PIPs), each PIP being programmable to connect one of said output lines to one of said input lines;
each logic unit comprising:
a logic element for performing logical operations on signals received on said input lines and providing a logic element output signal therefrom;
a mux array driving some of said output lines; and receiving as input signals said logic element output signal and a logic element output signal from at least one other logic element.

28. A field programmable logic device comprising a plurality of logic units, each logic unit connecting to:
a plurality of output lines extending from said logic unit comprising at least a first output line and a second output line, said first output line being shorter than said second output line;
a plurality of input lines extending into said logic unit, each input line connected to said logic unit so as to provide an input signal to said logic unit; and
a plurality of programmable interconnection points (PIPs), each PIP being programmable to connect one of said output lines to one of said input lines;
some of said logic units comprising:
a logic element for performing logical operations on signals received on said input lines and providing a logic element output signal therefrom;
a mux array driving some of said output lines; and receiving as input signals said logic element output signal and a logic element output signal from at least one other logic element;
and others of said logic units comprising:
a random access memory receiving input signals from some of said output lines and supplying output signals to some of said input lines.

29. A field programmable logic device comprising a plurality of logic units, each logic unit connected to:
a plurality of output lines extending from said logic unit comprising at least a first output line and a second output line, said first output line being shorter than said second output line;
a plurality of input lines extending into said logic unit, each input line connected to said logic unit so as to provide an input signal to said logic unit; and
a plurality of programmable interconnection points (PIPs), each PIP being programmable to connect one of said output lines to one of said input lines;
in which PIPs are placed on an output line such that the number of PIPs in one tile portion of an output line decreases as distance from said logic unit increases.

* * * * *